(12) United States Patent
Choi et al.

(10) Patent No.: US 11,853,132 B2
(45) Date of Patent: *Dec. 26, 2023

(54) DISPLAY APPARATUS

(71) Applicant: Samsung Display Co., Ltd., Yongin-si (KR)

(72) Inventors: Minhee Choi, Yongin-si (KR); Minchae Kwak, Yongin-si (KR); Byungsun Kim, Yongin-si (KR); Ilgoo Youn, Yongin-si (KR); Jieun Lee, Yongin-si (KR); Seunghan Jo, Yongin-si (KR); Junyoung Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,500

(22) Filed: May 27, 2022

(65) Prior Publication Data
US 2022/0283616 A1  Sep. 8, 2022

Related U.S. Application Data

(63) Continuation of application No. 16/938,457, filed on Jul. 24, 2020, now Pat. No. 11,347,283.

(30) Foreign Application Priority Data

Jul. 26, 2019  (KR) .......................... 10-2019-0091155

(51) Int. Cl.
G09G 5/00   (2006.01)
G06F 1/18   (2006.01)
(Continued)

(52) U.S. Cl.
CPC ........... G06F 1/189 (2013.01); G09G 3/3275 (2013.01); H10K 77/111 (2023.02)

(58) Field of Classification Search
CPC ............ G06F 1/189; G09G 2300/0426; G09G 2310/0281; G09G 3/035; G09G 3/3225;
(Continued)

(56) References Cited

U.S. PATENT DOCUMENTS 9,965,995 B2   5/2018  Chen et al.
10,224,504 B2  3/2019  Park
(Continued)

FOREIGN PATENT DOCUMENTS

KR  10-2017-0092173  8/2017
KR  10-2017-0130016  11/2017
KR  10-2018-0029168  3/2018

Primary Examiner — Insa Sadio
(74) Attorney, Agent, or Firm — KILE PARK REED & HOUTTEMAN PLLC

(57) ABSTRACT

A display apparatus includes a display unit having a display area and a non-display area, a first driver in the non-display area, a second driver in the non-display area and space apart from the first driver, a bending portion connected to the display unit, and a connector connected to the bending portion, wherein a first wire part connected to the first driver and a second wire part connected to the second driver are disposed in the non-display area, and the first wire part and the second wire part are connected to each other via a connection wire part.

27 Claims, 12 Drawing Sheets

(51) Int. Cl.
  *G09G 3/3275* (2016.01)
  *H10K 77/10* (2023.01)
(58) Field of Classification Search
  CPC ............... G09G 3/3233; G09G 3/3275; H01L
       27/3276; H01L 51/0097; Y02E 10/549
  See application file for complete search history.

(56) References Cited

U.S. PATENT DOCUMENTS

| | | |
|---|---|---|
| 10,411,045 B2 | 9/2019 | Kim et al. |
| 2004/0256996 A1 | 12/2004 | Osame et al. |
| 2013/0334509 A1* | 12/2013 | Hwang ................ G09G 3/3208 257/40 |
| 2014/0139771 A1 | 5/2014 | Choi |
| 2016/0027380 A1 | 1/2016 | Kim et al. |
| 2016/0351107 A1* | 12/2016 | Chen .................... G02F 1/1345 |
| 2017/0338295 A1 | 11/2017 | Lee et al. |
| 2018/0082643 A1 | 3/2018 | Jeong et al. |
| 2019/0115417 A1* | 4/2019 | Yamazaki ............ G04G 9/0088 |
| 2019/0198598 A1 | 6/2019 | Lee et al. |

* cited by examiner

DISPLAY APPARATUS

CROSS-REFERENCE TO RELATED APPLICATION(S)

This is a continuation application of U.S. patent application Ser. No. 16/938,457, filed Jul. 24, 2020, now issued as U.S. Pat. No. 11,347,283 on May 31, 2022, the disclosure of which is incorporated herein by reference in its entirety. U.S. patent application Ser. No. 16/938,457 claims priority to and benefits of Korean Patent Application No. 10-2019-0091155 under 35 U.S.C. § _119, filed on Jul. 26, 2019, in the Korean Intellectual Property Office, the entire contents of which are incorporated herein by reference.

BACKGROUND

1. Technical Field

One or more embodiments relate to a display apparatus in that configuration and size thereof are optimized, while providing an efficient and accurate transmission of signaling enabling an image to be displayed.

2. Description of Related Art

A display apparatus may generally include a display element and a driving circuit for controlling electrical signals applied to the display element. The driving circuit may include a thin-film transistor, a storage capacitor, and applicable wiring.

In order to precisely control emission of the display element and a degree of emission thereof, an increase in the number of thin-film transistors to be electrically connected to one display element may result. In this regard, integration of the connections and resulting power consumption of the display apparatus has become a focus of ongoing development of display apparatuses having the aforementioned emission controls.

SUMMARY

One or more embodiments may include a display apparatus that may minimize the width of a terminal part and may improve response performance.

Additional aspects will be set forth in part in the description which follows and, in part, will be apparent from the description, or may be learned by practice of the embodiments herein.

According to an embodiment, a display apparatus may include a display including a display area and a non-display area; a first driver in the non-display area; a second driver in the non-display area and spaced apart from the first driver; a bending portion connected to the display; and a connector connected to the bending portion, wherein a first wire part is connected to the first driver and a second wire part is connected to the second driver, and the first wire part and the second wire part are disposed in the non-display area, and the first wire part and the second wire part are connected to each other via a connection wire part.

The connection wire part may be disposed in the connector.

The display apparatus may include a terminal connected to the connection wire part.

The display apparatus may include a data driving circuit disposed in the connector.

The display area may have a circular shape.

The first wire part and the second wire part may be disposed on the same layer, and the connection wire part may be disposed on a different layer than the same layer on which the first wire part and the second wire part may be disposed.

At least one of the first wire part, the second wire part, and the connection wire part may be disposed in a different direction than another thereof.

At least one of the first wire part and the second wire part may extend perpendicularly with respect to a bending axis of the bending portion, and the connection wire part may extend parallel to the bending axis of the bending portion.

The display apparatus may include first wire parts and second wire parts may be provided. The first wire parts and the second wire parts may be disposed to be symmetric with respect to one another based on an arbitrary center line of the display apparatus.

The first and second wire parts, to which signals having the same polarity may be transmitted, may be symmetric with respect to each other based on the arbitrary center line of the display apparatus.

According to an embodiment, a display apparatus may include a substrate having a bending portion between a first area and a second area of the substrate, an inorganic insulating layer disposed on the substrate and having an opening corresponding to the bending portion, wire parts extending from the first area into the second area via the bending portion and disposed on the inorganic insulating layer to overlap at least a part of the opening, and an organic material layer between the inorganic insulating layer and the wire parts and filling the opening, wherein a part of the wire parts may be connected to a first driver in the first area, and another part of the wire parts may be connected to a second driver in the first area, and the part and the another part of the wire parts may be connected to the first driver and the second driver, respectively, via a connection wire part.

The connection wire part may be in the second area.

The connection wire part may be connected to a terminal.

The connection wire part may be disposed on the inorganic insulating layer differently than the wire units.

The part of the wire parts and the another part of wire parts may be symmetric with respect to each other based on an arbitrary center line of the display apparatus extending between the wire parts to divide the wire parts equally on either side of the arbitrary center line of the display apparatus.

The wire parts to which signals having the same polarity may be transmitted may be symmetric with respect to each other based on the arbitrary center line of the display apparatus.

Connection wire parts may be provided, and the connection wire parts may be spaced apart from one another on a plane to respectively connect parts of the wire parts connected to the first driver in the first area with other parts of the wire parts connected to the second driver in the first area.

The first area may have a circular shape.

The display apparatus may include a data driving circuit disposed in the second area.

Each of the wire parts and the connection wire part may be disposed in different directions with respect to each other.

Each of the wire parts may extend perpendicularly with respect to a bending axis of the bending portion, and the wire connection part may extend parallel to the bending axis of the bending portion.

According to an embodiment, a display apparatus may include a substrate having a bending portion between a first area and a second area of the display apparatus, an inorganic insulating layer disposed on the substrate and having an opening corresponding to the bending portion, wire parts extending from the first area into the second area via the bending portion and disposed on the inorganic insulating layer to overlap at least a part of the opening, and an organic material layer between the inorganic insulating layer and the wire parts and filling the opening, wherein a part of the wire parts may be connected to a first driver in the first area, and another part of the wire parts may be connected to a second driver in the first area, and the part and the another part of the wire parts may be connected to each other.

The part and the another part of the wire parts may be connected to each other via a connection wire part and extend perpendicularly with respect to a bending axis of the bending portion, and the connection wire part may extend parallel to the bending axis of the bending portion.

BRIEF DESCRIPTION OF THE DRAWINGS

The above and other aspects, features, and advantages of embodiments of the disclosure will be more apparent from the following description when taken in conjunction with the accompanying drawings, in which.

DETAILED DESCRIPTION OF THE EMBODIMENTS

Figure 1:
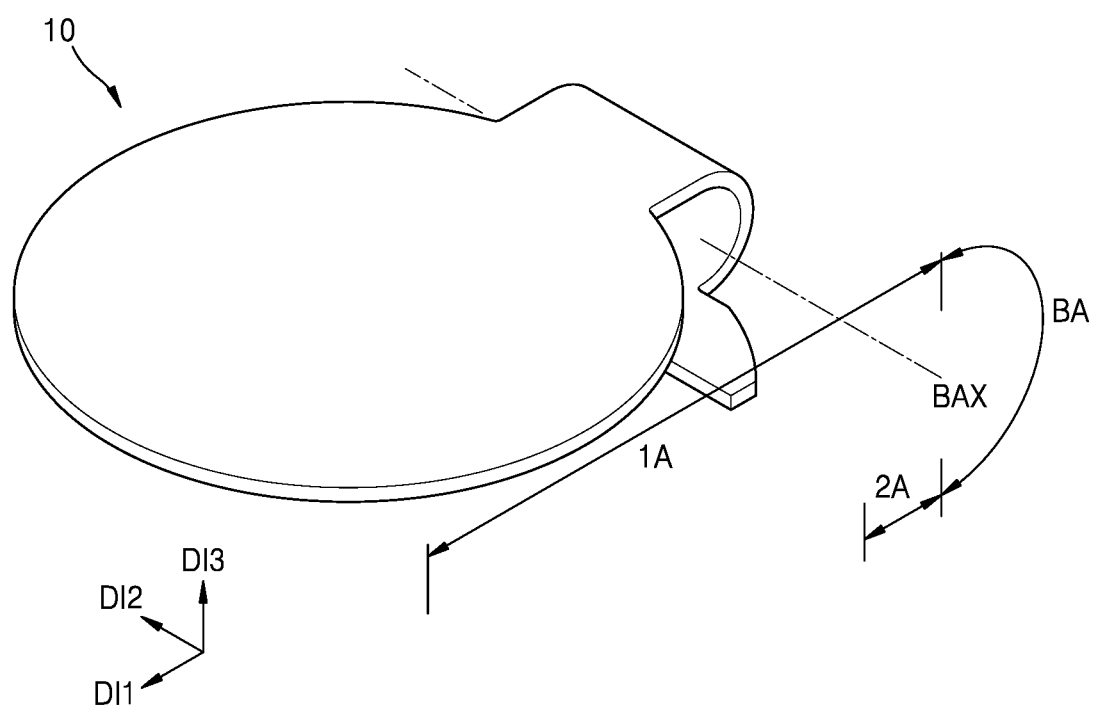
FIG. 1 shows a perspective view illustrating a display apparatus according to an embodiment.

Reference will now be made to embodiments illustrated in the accompanying drawings, wherein like reference numerals refer to like elements throughout. In this regard, the embodiments may have different forms and should not be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is described as being "formed on," another layer, region, or component, it may be directly or indirectly formed on the other layer, region, or component. For example, intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

The x-axis, the y-axis and the z-axis may not be limited to three axes of the rectangular coordinate system, and may be interpreted in a broader sense. For example, the x-axis, the y-axis, and the z-axis may be perpendicular to one another, or may represent different directions that may not be perpendicular to one another.

"About" or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

In a case that a certain embodiment may be implemented differently, a specific process order may be performed differently from the described order. For example, two consecutively described processes may be performed substantially at the same time or performed in an order opposite to the described order.

Figure 2:
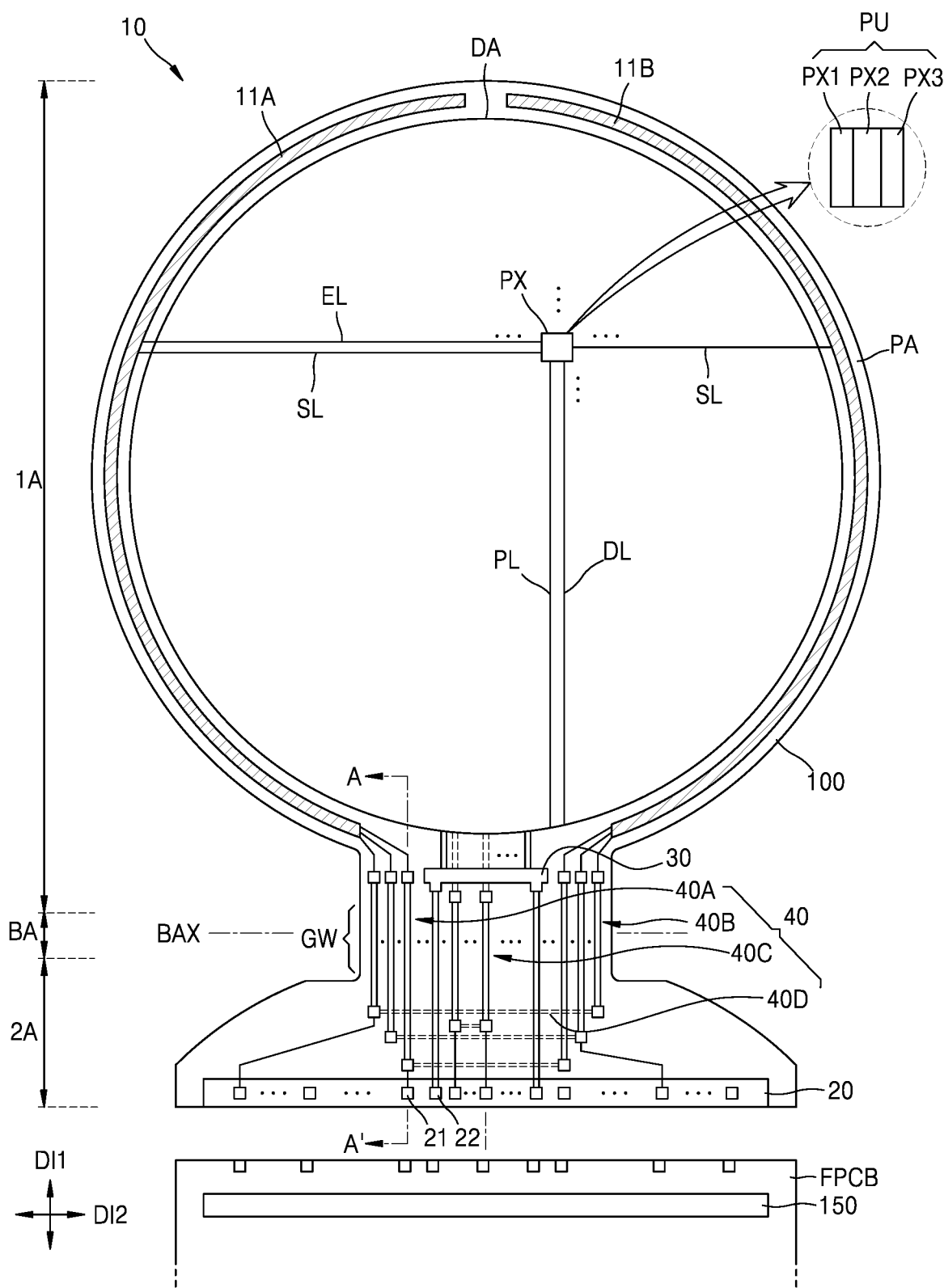
FIG. 2 shows a plan view illustrating the display apparatus illustrated in FIG. 1.
Figure 3A:
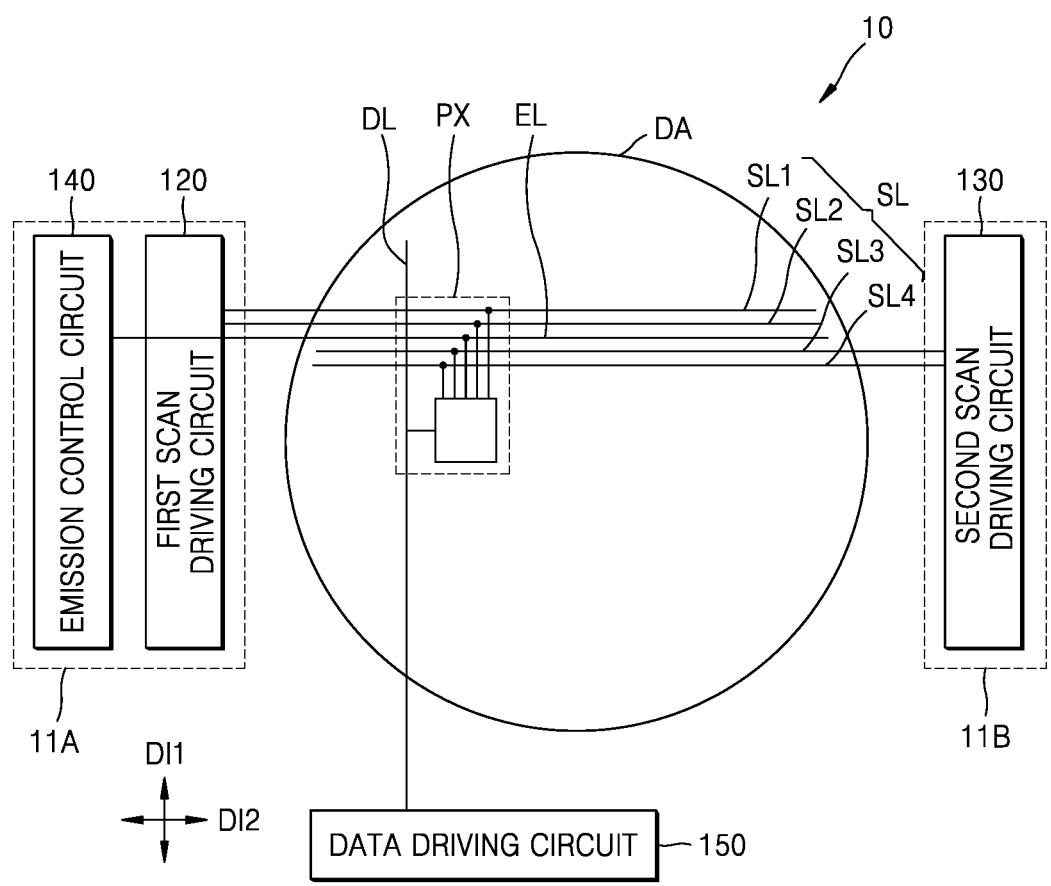
FIG. 3A shows a plan view illustrating a configuration of a layout of the display apparatus illustrated in FIG. 1.
Figure 3B:
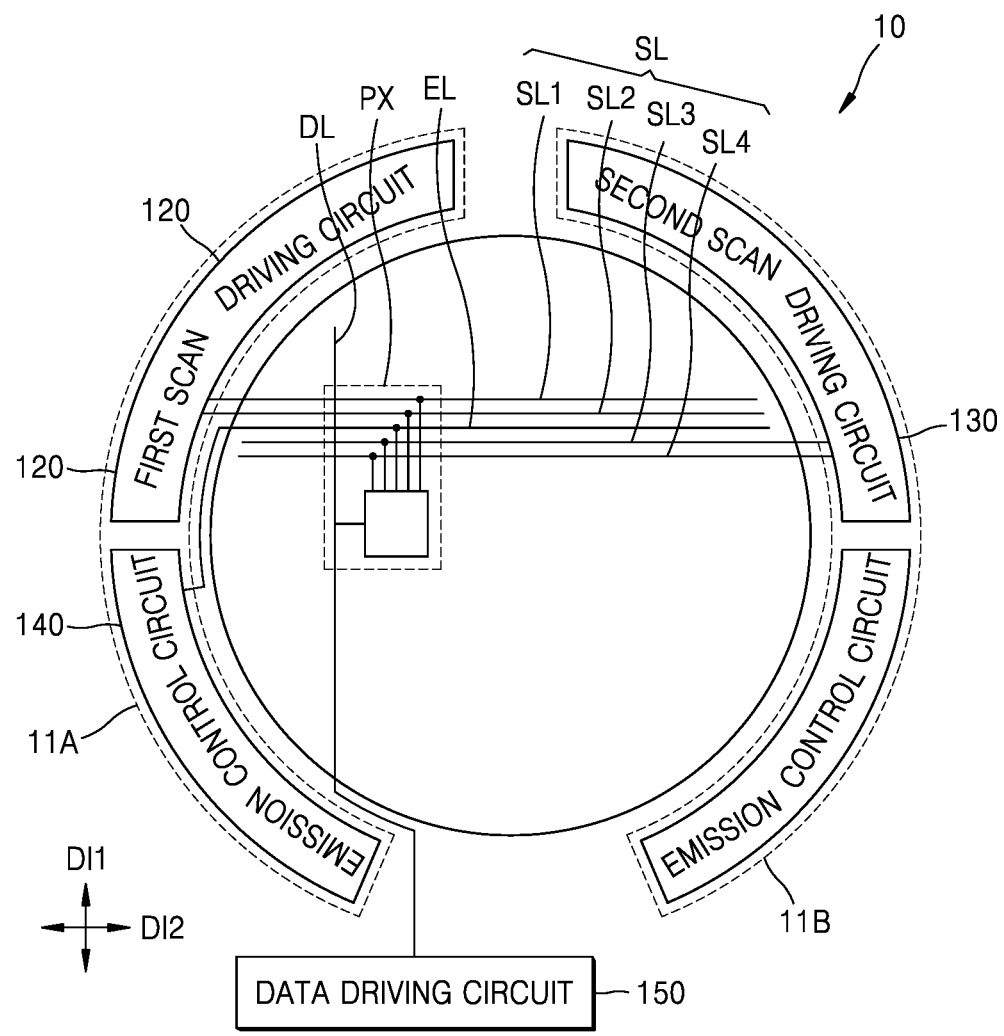
FIG. 3B shows a plan view illustrating a configuration of a layout of the display apparatus illustrated in FIG. 1.

FIG. 1 shows a perspective view illustrating a display apparatus 10 according to an embodiment. FIG. 2 shows a plan view illustrating the display apparatus 10 illustrated in FIG. 1. FIG. 3A shows a plan view illustrating a configuration of a layout of the display apparatus 10 of FIG. 1. FIG. 3B shows a view illustrating a configuration of a layout of the display apparatus 10 of FIG. 1.

Referring to FIGS. 1 through 3B, the display apparatus 10 may include a substrate 100. The substrate 100 may have a display area DA and a peripheral area PA including a non-display area outside the display area DA. The substrate 100 may include a first area 1A, a second area 2A, and a bending area or portion BA. The first area 1A may include a display, and the second area 2A may define a connector to be connected to an external device. The display may realize an image via the display area DA in a case that the display area DA may be exposed to the outside so as to be perceptible to a user. The display area DA described above may be included in the first area 1A. The peripheral area PA may include a part of the first area 1A outside of the display area DA, as well as parts of the second area 2A, and the bending area BA.

The first area 1A may have a non-rectangular shape. The non-rectangular shape may be a circular shape, an oval shape, a polygonal shape of which a part may be a circular shape, or a polygonal shape excluding a quadrangle.

The substrate 100 may include the bending area BA to extend in a first direction DI1. The bending area BA may be between the first area 1A and the second area 2A in a first direction DI1. For example, the substrate 100 may be bent based on a bending axis BAX that may extend in a second direction DI2 that crosses the first direction DI1, as shown in FIGS. 1 and 2. The substrate 100 may be bent according to a radius of curvature about the bending axis BAX. However, embodiments may not be limited thereto. For example, the substrate 100 may be bent in such a way that the radius of curvature may not be uniform relative to the bending axis BAX.

The substrate 100 may include various flexible or bendable materials. For example, the substrate 100 may include, but not be limited to, polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 may have a single layer or multiple layers including the materials described above. In a case that the substrate 100 may have multiple layers, the substrate 100 may include an inorganic layer.

The first area 1A may include the display area DA. For example, the first area 1A may include the display area DA and a part of the peripheral area PA outside of the display area DA, as shown in FIG. 2. The second area 2A may include another part of the peripheral area PA.

Pixels PX may be arranged in the display area DA of the substrate 100 and thus, an image may be displayed. Devices, such as a thin-film transistor TFT, an organic light-emitting device OLED, and a capacitor Cst, may be positioned in the display area DA.

The display area DA may have a shape corresponding to the shape of a part of the substrate 100. In FIG. 2, the part of the substrate 100 may have a circular shape, and the display area DA may have a corresponding circular shape.

The pixels PX and signal lines for applying electrical signals to the pixels PX may be positioned in the display area DA. The pixels PX may include a first pixel PX1 that may emit light having a first color, a second pixel PX2 that may emit light having a second color, and a third pixel PX3 that may emit light having a third color. A pixel unit PU may include the first pixel PX1, the second pixel PX2 and the third pixel PX3. As shown in FIG. 2, for example, pixel units PU may be repeatedly arranged in the first direction DI1 and the second direction DI2. The pixel units PU may be properly arranged according to the shape of the display area DA.

The signal lines for applying electrical signals to each of the pixels PX may include data lines DL, scan lines SL1 to SL4, and emission control lines EL. Each of the data lines DL may extend in the first direction DI1. Each of the scan lines SL1 to SL4 and the emission control lines EL may extend in the second direction DI2.

Each of the pixels PX may be connected to a corresponding scan line among the scan lines SL1 to SL4, a corresponding emission control line among the emission control lines EL, and a corresponding data line DL among the data lines DL.

Signal lines, such as a driving voltage line PL for transmitting power, and a common power supply line, may be further included in the display area DA. The driving voltage line PL may be connected to a driving power supply line 30 in the peripheral area PA. Also, although not shown, the common power supply line, a gate driver, and a data driver, may be disposed in the peripheral area PA.

A driver for supplying signals for driving the pixels PX may be disposed in the peripheral area PA where the pixels PX may not be disposed. For example, a first driver 11A and a second driver 11B, which may be spaced apart from each other, may be in the peripheral area PA. The first driver 11A and the second driver 11B may transmit the same signal or different signals to each of the pixels PX. For example, one of the first driver 11A and the second driver 11B may include one of a first scan driving circuit 120, a second scan driving circuit 130, and an emission control circuit 140. Another one of the first driver 11A and the second driver 11B may include another one of the first scan driving circuit 120, the second scan driving circuit 130, and the emission control circuit 140. In another embodiment, one of the first driver 11A and the second driver 11B may include two of the first scan driving circuit 120, the second scan driving circuit 130, and the emission control circuit 140, and another one of the first driver 11A and the second driver 11B may include one of the first scan driving circuit 120, the second scan driving circuit 130, and the emission control circuit 140. In another embodiment, each of the first driver 11A and the second driver 11B may include a scan driving circuit and the emission control circuit 140. In a case that one driver may include at least two circuits, such as a scan driving circuit, an emission control circuit, and a test circuit, as described above (see FIG. 3B), at least two circuits may be arranged in a line, so as to be adjacent one another, along a border of the display area DA. For example, one of at least two circuits and another one thereof may be spaced apart from each other along the border of the display area DA. Thus, only one circuit of the aforementioned three circuits may be disposed outside the display area DA. Thus, a scan driving circuits, emission control circuits, and test circuits may be provided. The scan driving circuits, the emission control circuits, and the test circuits may be spaced apart from one another. A scan driving circuit, an emission control circuit, and a test circuit may be alternately arranged with respect to each other. Although not shown in FIG. 3B, at least one scan driving circuit, at least one emission control circuit, and at least one test circuit may be arranged in one of an area in which the first scan driving circuit 120 of FIG. 3B may be disposed, an area in which the second scan driving circuit 130 may be disposed, and/or an area in which the emission control circuit 140 may be disposed. In another embodiment, a part of multiple circuits may be disposed in a part of a border of the display area DA, and the other part of the those circuits may be disposed in another part of the border of the display area DA. With this configuration, a part of the circuits and another part of the circuits may be arranged in a line, so as to be adjacent to one another, outside of the border of the display area DA. The arrangements discussed above may not be limited thereto, such that multiple circuits may be arranged by combining the arrangement methods described above.

A discussion of a case where the first driver 11A may include the first scan driving circuit 120 and the emission control circuit 140 and the second driver 11B may include the second scan driving circuit 130, follows hereinafter. The first driver 11A and the second driver 11B may face each other, as shown in FIG. 2. The first driver 11A and the second driver 11B described above is not limited to the above description but may include the gate driver and the data driver described above.

The first scan driving circuit 120 and the second scan driving circuit 130 may output each scan signal to each scan line SL. The emission control circuit 140 may output an emission control signal (see EM of FIG. 4) to the emission control lines EL. The data driving circuit 150 may output a data signal (see DATA of FIG. 4) to the data lines DL.

The first scan driving circuit 120, the second scan driving circuit 130, and the emission control circuit 140 may be positioned in the peripheral area PA of the first area 1A along ends of the display area DA, i.e., along a circumference of the display area DA.

The data driving circuit 150 may be disposed in various ways. For example, the data driving circuit 150 may be disposed directly on an upper portion of the substrate 100 that may extend from a remainder of the substrate 100 and protrude therefrom by using a chip on glass (COG) or chip on plastic (COP) method. In another embodiment, the data driving circuit 150 may be positioned on an additional flexible printed circuit board (FPCB). The FPCB may be connected to a terminal part 20. As discussed hereinbelow, the data driving circuit 150 may be disposed on the FPCB.

The terminal part 20 may be positioned at one end of the peripheral area PA and may include terminals 21 and 22. The terminal part 20 may not be covered by an insulating layer, and may be exposed to be electrically connected to the FPCB or a controller (not shown), such as a driver integrated circuit (IC). The controller may provide a data signal, a gate signal, a driving voltage ELVDD, and a common voltage ELVSS.

The driving power supply line 30 may be connected to the controller via a driving terminal 22 and may provide the driving voltage ELVDD supplied from the controller to the pixels PX via the driving voltage line PL. The driving power supply line 30 may be disposed in the peripheral area PA so as to along one side or area of the display area DA.

A wiring 40 may include a first wire part 40A, a second wire part 40B, a third wire part 40C, and a connection wire part 40D. The first wire part 40A, the second wire part 40B, and the third wire part 40C may overlap or face the bending area BA. The first wire part 40A, the second wire part 40B, and the third wire part 40C may extend from the first area 1A into the second area 2A via the bending area BA. The first wire part 40A, the second wire part 40B, and the third wire part 40C may cross the bending axis BAX and extend to the terminal part 20. For example, the first wire part 40A, the second wire part 40B, and the third wire part 40C may extend vertically with respect to the bending axis BAX. However, embodiments may not be limited thereto. For example, various modifications may be provided, including, for example, a case in which the first wire part 40A, the second wire part 40B, and the third wire part 40C may extend obliquely with a predetermined angle with respect to the bending axis BAX. The first wire part 40A, the second wire part 40B, and the third wire part 40C may have various shapes, such as a curved shape, and a zigzag shape.

At least one of the first wire part 40A, the second wire part 40B, and the third wire part 40C described above may be provided as multiples thereof. For example, the first wire part 40A may include at least one first wire part 40A. The second wire part 40B may include at least one second wire part 40B. The third wire part 40C may include multiple third wire parts 40C. Each first wire part 40A may be connected to the first driver 11A, and each second wire part 40B may be connected to the second driver 11B. A part of the first wire parts 40A may be connected to the first scan driving circuit 120, and another part of the first wire parts 40A may be connected to the emission control circuit 140. A part of the third wire parts 40C may be connected to the driving power supply line 30, and another part of the third wire parts 40C may be connected to the data line DL. The third wire parts 40C that may be connected to the data line DL may cross the driving power supply line 30 so as to supply a data or gate signal to the display area DA. The third wire parts 40C that may be connected to the data line DL may be connected to wires of another layer via a contact hole.

The first wire parts 40A, the second wire parts 40B, and the third wire parts 40C described above may be arranged at various positions. However, a discussion of a case in which the first wire parts 40A, the second wire parts 40B, and the third wire parts 40C may be arranged as shown in FIG. 2, for example, follows below.

The connection wire part 40D may connect, for example, two of the wirings 40. The connection wire part 40D may connect, for example, two wires of wirings 40, for applying the same signal to each other. For example, the connection wire part 40D may connect one of the first wire parts 40A to one of the second wire parts 40B. In other words, the connection wire part 40D may provide a connection among the first wire parts 40A and the second wire parts 40B. One terminal 21 or 22 may be connected to the connection wire part 40D.

The connection wire part 40D may be connected to one of the first wire parts 40A and one of the second wire parts 40B. The connection wire part 40D may connect two different wire parts of the third wire parts 40C.

The connection wire part 40D may be arranged in a second direction DI2 that may be different from a first direction DI1. For example, the connection wire part 40D may be formed to have a lengthwise dimension in a direction parallel to the bending axis BAX, and be perpendicular to one of the wire parts 40A, 40B, and/or 40C.

Multiple connection wire parts 40D may be provided. The connection wire parts 40D may be spaced apart from one another along a lengthwise direction of each wire part 40A, 40B, and/or 40C. Each of the connection wire parts 40D may not overlap one another on a plane so as to be offset from each other. The connection wire part 40D may be disposed on a different layer from a layer on which the first wire parts 40A, the second wire parts 40B, and the third wire parts 40C may be disposed One connection wire part 40D described above may be connected to one terminal 21 or 22. Signals input to one terminal 21 or 22 may be transmitted to the first wire parts 40A and the second wire parts 40B via the connection wire part 40D and thus to the first driver 11A and the second driver 11B via the first wire parts 40A and the second wire parts 40B, respectively. For example, these signals may be signals that may be commonly used by the first driver 11A and the second driver 11B. For example, these signals may include at least one of a variety of signals such as a start signal, an initialization voltage, a gate control signal, a clock signal, and a voltage.

In a case that the same signal transmitted to the first driver 11A and the second driver 11B via the connection wire part 40D may input to one terminal 21 or 22, the display apparatus 10 may reduce a size of the terminal part 20 and the size of the peripheral area PA. For example, a size of the peripheral area PA in the bending area BA and the second area 2A may be reduced as a result of the connection wire part 40D enabling delivery of that same signal to other, different wire parts, e.g., wire parts 40A and 40B.

In view of the above, the display apparatus 10 may minimize a delay that may be generated in a case that the same signal may be transmitted to the first driver 11A and the second driver 11B.

The display apparatus 10 may prevent each of the wire parts from being connected to another one, which otherwise would occur due to a narrow space for the wire parts and their arrangement resulted from that the bending area BA is narrower than other portions of the display apparatus 10.

Figure 4:
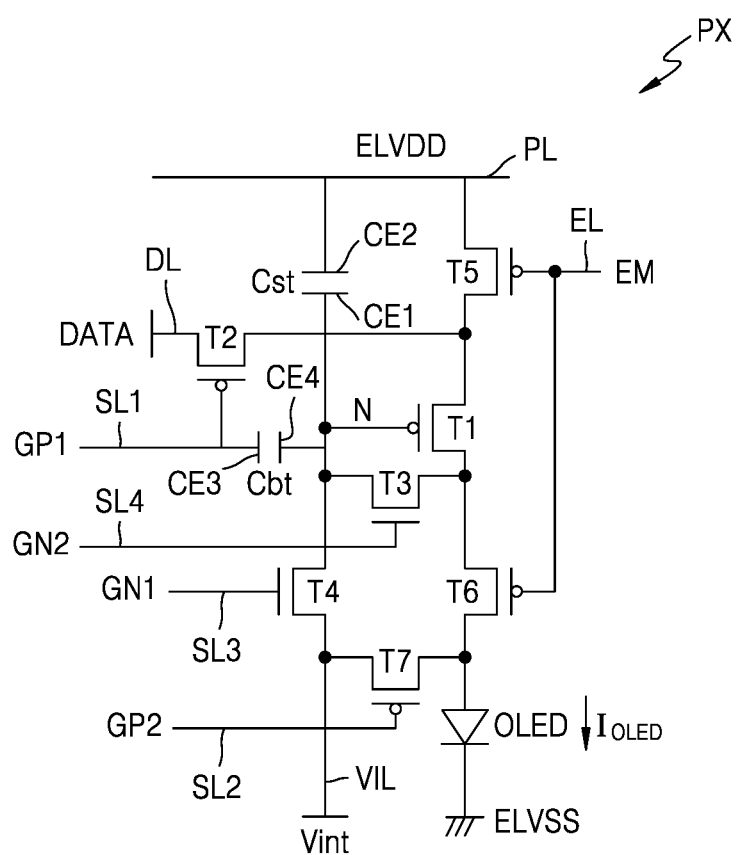
FIG. 4 shows a schematic diagram of an equivalent circuit of a pixel according to an embodiment.

FIG. 4 shows a schematic diagram of an equivalent circuit of a pixel according to an embodiment.

Referring to FIG. 4, each pixel PX may include first through seventh transistors T1, T2, T3, T4, T5, T6, and T7, a first capacitor Cst, a second capacitor Cbt, an organic light-emitting device OLED as a display element, signal lines SL1, SL1, SL3, SL4, EL, and data lines DL connected thereto, an initialization voltage line VIL, and a driving voltage line PL. In another embodiment (not shown), at least one of the signal lines SL1, SL1, SL3, SL4, EL, and data lines DL, the initialization voltage line VIL, and/or the driving voltage line PL may be shared by adjacent pixels. The first through seventh transistors T1 to T7 may include thin-film transistors. In FIG. 4, the third transistor T3 and the fourth transistor T4 may include n-channel metal oxide semiconductor field-effect transistors (i.e., NMOSFETs), and others may include p-channel MOSFETs (i.e., PMOSFETs).

The signal lines may include the data lines DL, first scan lines SL1, second scan lines SL2, third scan lines SL3, fourth scan lines SL4, and emission control lines EL. The second scan line SL2 may be connected to the first scan line SL1, and a first scan signal GP1 may be a second scan signal GP2.

The driving voltage line PL may transmit the driving voltage ELVDD to the first transistor T1, and the initialization voltage line VIL may transmit an initialization voltage Vint for initializing the first transistor T1 and an organic light-emitting device OLED to a pixel PX.

The first scan line SL1, the second scan line SL2, the third scan line SL3, the fourth scan line SL4, the emission control line EL, and the initialization voltage line VIL may extend in the second direction DI2 and may be spaced apart from one another according to rows. The data line DL and the driving voltage line PL may extend in the first direction DI1 and may be apart from each other according to columns.

The first transistor T1 may be connected to the driving voltage line PL via the fifth transistor T5 and may be electrically connected to the organic light-emitting device OLED via the sixth transistor T6. The first transistor T1 may function as a driving transistor, may receive a data signal DATA according to a switching operation of the second transistor T2, and may supply a driving current $I_{OLED}$ to the organic light-emitting device OLED.

The second transistor T2 may be connected to the first scan line SL1 and the data line DL and may be connected to the driving voltage line PL via the fifth transistor T5. The second transistor T2 may be turned on according to the first scan signal GP1 transmitted via the first scan line SL1 and may perform a switching operation of transmitting the data signal DATA, that may be transmitted to the data line DL, to a node N.

The third transistor T3 may be connected to the fourth scan line SL4 and may be connected to the organic light-emitting device OLED via the sixth transistor T6. The third transistor T3 may be turned on according to the fourth scan signal GN2 transmitted via the fourth scan line SL4 and may diode-connect the first transistor T1.

The fourth transistor T4 may be connected to the third scan line SL3 and the initialization voltage line VIL, may be turned on according to the third scan signal GNI transmitted via the third scan line SL3, and may transmit the initialization voltage Vint from the initialization voltage line VIL to a gate electrode of the first transistor T1, thereby initializing a voltage of the gate electrode of the first transistor T1.

The fifth transistor T5 and the sixth transistor T6 may be connected to the emission control line EL, may be simultaneously turned on according to the emission control signal EM transmitted via the emission control line EL, and may form a current path on which the driving current $I_{OLED}$ may flow in a direction of the organic light-emitting device OLED from the driving voltage line PL.

The seventh transistor T7 may be connected to the second scan line SL2 and the initialization voltage line VIL, may be turned on according to the second scan signal GP2 transmitted via the second scan line SL2, and may transmit the initialization voltage Vint from the initialization voltage line VIL to the organic light-emitting device OLED, thereby initializing the organic light-emitting device OLED. The seventh transistor T7 may be omitted in other embodiments.

The first capacitor Cst may include a first electrode CE1 and a second electrode CE2. The first electrode CE1 may be connected to the gate electrode of the first transistor T1, and the second electrode CE2 may be connected to the driving voltage line PL. The first capacitor Cst may store and maintain a voltage corresponding to a difference between both-end voltages of the driving voltage line PL and the gate electrode of the first transistor T1, thereby maintaining a voltage applied to the gate electrode of the first transistor T1.

The second capacitor Cbt may include a third electrode CE3 and a fourth electrode CE4. The third electrode CE3 may be connected to the first scan line SL1 and the gate electrode of the second transistor T2. The fourth electrode CE4 may be connected to the gate electrode of the first transistor T1 and the first electrode CE1 of the first capacitor Cst. The second capacitor Cbt may be a boosting capacitor that may boost a voltage of the node N to reduce a voltage (e.g., a black voltage) for displaying black in a case that the first scan signal GP1 of the first scan line SL1 may be a voltage for turning off the second transistor T2.

The organic light-emitting device OLED may include a pixel electrode and an opposite electrode, and the opposite electrode may receive the common voltage ELVSS. The organic light-emitting device OLED may receive the driving current $I_{OLED}$ from the first transistor T1 and may emit light, thereby displaying an image.

In a case that the third scan signal GN1 may be supplied via the third scan line SL3 for an initialization period, the fourth transistor T4 may be turned on according to the third scan signal GN1, and the first transistor T1 may be initialized by the initialization voltage Vint supplied from the initialization voltage line VIL.

For a data programming period, in a case that the first scan signal GP1, the second scan signal GP2, and the fourth scan signal GN2 may be supplied via the first scan line SL1, the second scan line SL2 and the fourth scan line SL4, the second transistor T2, the seventh transistor T7, and the third transistor T3 may be turned on according to the first scan signal GP1, the second scan signal GP2, and the fourth scan signal GN2. The first transistor T1 may be diode-connected by the turned-on third transistor T3 and may be biased in a forward direction. A voltage, in which a threshold voltage Vth of the first transistor T1 may be compensated from the data signal DATA supplied from the data line DL, may be applied to the gate electrode of the first transistor T1. The organic light-emitting device OLED may be initialized by the initialization voltage Vint supplied from the initialization voltage line VIL by the turned-on seventh transistor T7. The first driving voltage ELVDD and the compensation voltage may be applied to both ends of the first capacitor Cst, and an electric charge corresponding to a both-end voltage difference may be stored in the first capacitor Cst.

For an emission period, the fifth transistor T5 and the sixth transistor T6 may be turned on by the emission control signal EM supplied from the emission control line EL. The driving current $I_{OLED}$ may be generated due to a voltage difference between a voltage of the gate electrode of the first transistor T1 and the first driving voltage ELVDD, and the driving current $I_{OLED}$ may be supplied to the organic light-emitting device OLED via the sixth transistor T6.

At least one of the transistors T1 to T7 may include a semiconductor layer including an oxide, and others may include a semiconductor layer including silicon. A first transistor that directly effects brightness of a display apparatus may include a semiconductor layer including polycrystalline silicon, and thus, a display apparatus having high resolution may be achieved.

Because an oxide semiconductor may have high carrier mobility and a low leakage current, even though a driving time may be long, a voltage drop may not be excessive. For example, even during low frequency driving, a change of color of an image according to the voltage drop may not be excessive and thus, low frequency driving may be performed. Because the oxide semiconductor may have a low leakage current, at least one of the third transistor T3 and the fourth transistor T4 connected to the gate electrode of the first transistor T1 may be employed as an oxide semiconductor and thus, a leakage current that may flow through the gate electrode of the first transistor T1 may be prevented, and simultaneously, power consumption may be reduced.

Figure 5:
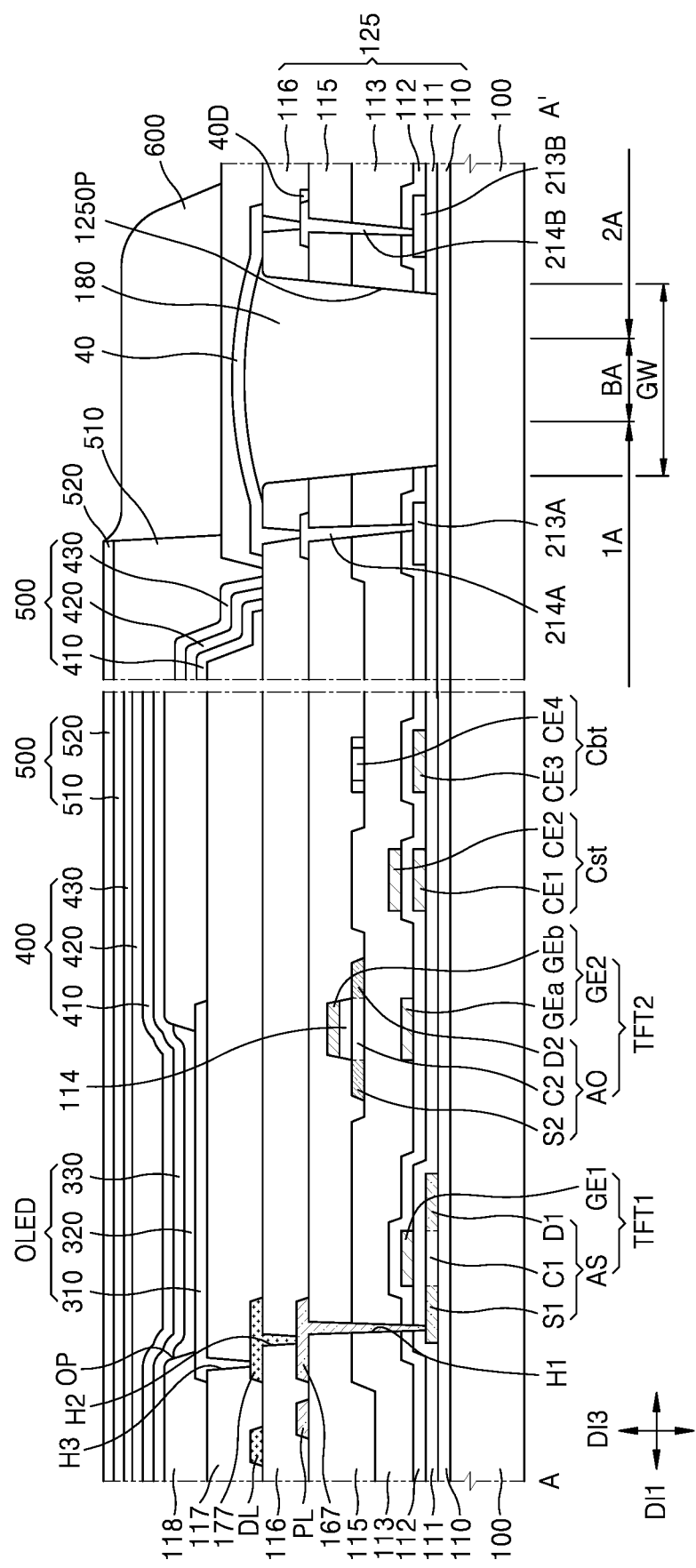
FIG. 5 shows a schematic cross-sectional view of the display apparatus taken along line A-A' of FIG. 2.

FIG. 5 shows a schematic cross-sectional view of the display apparatus taken along line A-A' of FIG. 2.

Referring to FIG. 5, the display apparatus may include a substrate 100, a first thin-film transistor TFT1 including a silicon oxide, a second thin-film transistor TFT2 including an oxide semiconductor, a first capacitor Cst, and a second capacitor Cbt. The first thin-film transistor TFT1 may include the first transistor T1, the second transistor T2, the fifth transistor T5, the sixth transistor T6, or the seventh transistor T7. The second thin-film transistor TFT2 may include the third transistor T3 or the fourth transistor T4 of FIG. 4.

The substrate 100 may include, for example, a glass material, a ceramic material, a metal material, or a flexible or bendable material. In a case that the substrate 100 may be flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 may have a single layer or multiple layers including the materials described above. In a case that the substrate 100 has multiple layers, the substrate 100 may include an inorganic layer. In an embodiment, the substrate 100 may include layering including an organic material/inorganic material/organic material.

The buffer layer 110 may improve smoothness of a top surface of the substrate 100. The buffer layer 110 may include, but not be limited to, an oxide layer, such as silicon oxide (SiOx), and/or a nitride layer, such as silicon nitride (SiNx), silicon oxynitride (SiON), or a combination thereof.

A barrier layer (not shown) may be positioned between the substrate 100 and the buffer layer 110. The barrier layer may prevent an impurity from the substrate 100 from penetrating into the silicon semiconductor layer or may minimize penetration thereof. The barrier layer may include an inorganic material and/or an organic material, such as oxide or nitride, and may have a single layer or multiple layers including the inorganic material and the organic material.

A first semiconductor layer AS of the first thin-film transistor TFT1 including a silicon semiconductor may be disposed on the buffer layer 110. The first semiconductor layer AS may include a source area S1 and a drain area D1, which may have conductivity caused by the doped impurity and may be spaced apart from each other, with a channel area C1 therebetween. The source area S1 and the drain area D1 may correspond to a source electrode and a drain electrode of the first thin-film transistor TFT1, respectively. Positions of the source area S1 and the drain area D1 may be switched.

A gate electrode GE1 of the first thin-film transistor TFT1 may be positioned on the first semiconductor layer AS, and a first insulating layer 111 may be positioned between the first semiconductor layer AS and the gate electrode GE1.

The first insulating layer 111 may include an inorganic material including an oxide or a nitride. For example, the first insulating layer 111 may include, but not be limited to, at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), or a combination thereof.

The gate electrode GE1 of the first thin-film transistor TFT1 may overlap or face the channel area C1 of the first semiconductor layer AS and may include, but not be limited to, at least one of molybdenum (Mo), copper (Cu), titanium (Ti), and aluminum (Al), or a combination thereof. The gate electrode GE1 may have a single layer or multiple layers including at least one of the materials described above.

The first electrode CE1 of the first capacitor Cst and the third electrode CE3 of the second capacitor Cbt may be positioned on the same layer as the gate electrode GE1 of the first thin-film transistor TFT1.

A second insulating layer 112 may be positioned on the gate electrode GE1 of the first thin-film transistor TFT1, the first electrode CE1 of the first capacitor Cst, and the third electrode CE3 of the second capacitor Cbt.

The second insulating layer 112 may include, but not be limited to, an inorganic material including oxide or nitride, or a combination thereof. For example, the second insulating layer 112 may include, but not be limited to, at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), or a combination thereof.

The second electrode CE2 of the first capacitor Cst may be positioned on the second insulating layer 112 so as to overlap or face the first electrode CE1 of the first capacitor Cst. The second electrode CE2 may include, but not be limited to, at least one of Mo, Cu, and Ti, or a combination thereof. The second electrode CE2 may have a single layer or multiple layers including at least one of the materials described above.

A third insulating layer 113 may be positioned on the second electrode CE2 of the first capacitor Cst. The third insulating layer 113 may include, but not be limited to, an inorganic material including oxide, nitride, or a combination thereof. For example, the third insulating layer 113 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), or a combination thereof.

Although FIG. 5 shows the first capacitor Cst as being spaced apart from the first thin-film transistor TFT1 in the first direction DI1, the first capacitor Cst may overlap or face the first thin-film transistor TFT1. For example, the second electrode CE2 may be disposed on an upper portion of the gate electrode GE1 of the first thin-film transistor TFT1 so as to overlap or face the gate electrode GE1. The gate electrode GE1 of the first thin-film transistor TFT1 may function as both a gate electrode and the first electrode CE1 of the first capacitor Cst.

A second semiconductor layer AO of the second thin-film transistor TFT2 including an oxide semiconductor may be positioned on the third insulating layer 113. The second semiconductor layer AO may include a source area S2 and a drain area D2, which may have conductivity and may be spaced apart from each other, with a channel area C2 between the source area S2 and the drain area D2. The oxide semiconductor may include, but not be limited to, a zinc (Zn) oxide-based material, such as a Zn oxide, an indium (In)—Zn oxide, a gallium (Ga)—In—Zn oxide, or a combination thereof. For example, the second semiconductor layer AO may include, but not be limited to, an In—Ga—Zn—O (IGZO) semiconductor, an In-tin (Sn)—Zn—O (ITZO) semiconductor, or an In—Ga—Sn—Zn—O (IGTZO) semiconductor in which a metal, such as In, Ga, or Sn, is contained in ZnO. The source area S2 and the drain area D2 of the second semiconductor layer AO may be formed by controlling carrier concentration of the oxide semiconductor and by making the oxide semiconductor conductive. For example, the source area S2 and the drain area D2 may be formed by increasing carrier concentration through application of plasma treatment, using a hydrogen (H)-based gas, a fluorine (F)-based gas, or a combination thereof, onto the oxide semiconductor.

A first gate electrode GEa may be positioned under the second semiconductor layer AO of the second thin-film transistor TFT2, and a second gate electrode GEb may be positioned on the second semiconductor layer AO of the second thin-film transistor TFT2. For example, the second thin-film transistor TFT2 may include a dual gate electrode. The third insulating layer 113 may be between the first gate electrode GEa and the second semiconductor layer AO of the second thin-film transistor TFT2. The first gate electrode GEa of the second thin-film transistor TFT2 may be formed of the same material and on the same layer as the second electrode CE2 of the first capacitor Cst. At least the channel area C2 of the second semiconductor layer AO may overlap or face the first gate electrode GEa of the second thin-film transistor TFT2.

A fourth insulating layer 114 may be positioned between the second semiconductor layer AO and the second gate electrode GEb of the second thin-film transistor TFT2. The second gate electrode GEb may overlap or face the channel area C2 of the second semiconductor layer AO. The fourth insulating layer 114 may be formed using a same mask process as may be used for forming the second gate electrode GEb. The fourth insulating layer 114 may be formed to have the same shape as that of the second gate electrode GEb.

The fourth insulating layer 114 may include an inorganic material including, but not limited to, oxide, nitride, or a combination thereof. For example, the fourth insulating layer 114 may include, but not be limited to, at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), or a combination thereof. The second gate electrode GEb may include, but not be limited to, at least one of Mo, Cu, Ti, and Al, or a combination thereof. The second gate electrode GEb may have a single layer or multiple layers including at least one of the materials described above.

A fourth electrode CE4 of the second capacitor Cbt may be formed on the third insulating layer 113 so as to overlap or face the third electrode CE3. The fourth electrode CE4 of the second capacitor Cbt may include an oxide semiconductor. The fourth electrode CE4 of the second capacitor Cbt may extend from the second semiconductor layer AO of the second thin-film transistor TFT2 and may overlap or face the third electrode CE3. The second insulating layer 112 and the third insulating layer 113 may be disposed between the third electrode CE3 and the fourth electrode CE4.

The fifth insulating layer 115 may cover the second thin-film transistor TFT2. The fifth insulating layer 115 may be disposed on the second gate electrode GEb, and the driving voltage line PL and the first connection electrode 167 may be disposed on the fifth insulating layer 115.

The fifth insulating layer 115 may include an inorganic material including, but not limited to, oxide, nitride, or a combination thereof. For example, the fifth insulating layer 115 may include, but not be limited to, at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), or a combination thereof.

The driving voltage line PL and the first connection electrode 167 may include a material having high conductivity, such as metal, or a conductive oxide. For example, the driving voltage line PL and the first connection electrode 167 may have a single layer or multiple layers including, but not limited to, at least one of Al, Cu, and Ti, or a combination thereof. The driving voltage line PL and the first connection electrode 167 may have a triple layer of, for example, Ti/Al/Ti, which may be sequentially disposed.

The first connection electrode 167 may be connected to the first semiconductor layer AS via a contact hole H1. The contact hole H1 may pass through the first insulating layer 111, the second insulating layer 112, the third insulating layer 113, and the fifth insulating layer 115 and may expose a part of the first semiconductor layer AS. A part of the first connection electrode 167 may be inserted into the contact hole H1, and thus may be electrically connected to the first semiconductor layer AS.

A sixth insulating layer 116 may be a planarization layer that may be disposed on the driving voltage line PL and the first connection electrode 167. The sixth insulating layer 116 may include an organic material, such as benzocyclobutene (BCB), polyimide, or hexamethyldisiloxane (HMDSO). As another example, the sixth insulating layer 116 may include an inorganic material. The sixth insulating layer 116 may function as a protective layer for covering the first thin-film transistor TFT1 and the second thin-film transistor TFT2, and an upper portion of the sixth insulating layer 116 may be flat. The sixth insulating layer 116 may include a single layer or multiple.

The data line DL and the second connection electrode 177 may be positioned on the sixth insulating layer 116. A part of the data line DL may overlap or face the driving voltage line PL. The second connection electrode 177 may be connected to the first connection electrode 167 via a contact hole H2 defined in the sixth insulating layer 116. The data line DL and the second connection electrode 177 may include a conductive material, such as metal, or a conductive oxide. For example, the data line DL and the second connection electrode 177 may include a single layer or multiple layers including at least one of Al, Cu, and Ti. A seventh insulating layer 117 may be disposed on the data line DL and the second connection electrode 177.

An organic light-emitting device OLED may be disposed on the seventh insulating layer 117. The organic light-emitting device OLED may include a pixel electrode 310, an opposite electrode 330, and an intermediate layer 320 between the pixel electrode 310 and the opposite electrode 330 that may form an emission layer.

The pixel electrode 310 may be connected to the second connection electrode 177 via the contact hole H3 defined in the seventh insulating layer 117 and may be connected to the first thin-film transistor TFT1 by the second connection electrode 177 and the first connection electrode 167.

An eighth insulating layer 118 may be a pixel-defining layer that may be positioned on the seventh insulating layer 117. The eighth insulating layer 118 may have an opening corresponding to each of the pixels PX, i.e., an opening OP through which a part of the pixel electrode 310 may be exposed, thereby defining a pixel PX. The eighth insulating layer 118 may increase a distance between ends of the pixel electrode 310 and the opposite electrode 330 that may be disposed on the pixel electrode 310, thereby preventing an arc from occurring in the ends of the pixel electrode 310. The eighth insulating layer 118 may be formed of an organic material, such as polyimide or HMDSO.

The pixel electrode 310 may be disposed on the seventh insulating layer 117 and may include, but not be limited to, a conductive oxide, such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In another embodiment, the pixel electrode 310 may include a reflective layer including, but not limited to, silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the pixel electrode 310 may further include a layer formed of, for example, ITO, IZO, ZnO, $In_2O_3$, or a combination thereof, on/under the reflective layer described above.

The intermediate layer 320 of the organic light-emitting device OLED may include an emission layer, as noted above. The emission layer may include a polymer or small molecular weight organic material that may emit light having a certain color. The emission layer may include a red emission layer, a green emission layer, or a blue emission layer. As another example, the emission layer may have a multi-layer structure in which a red emission layer, a green emission layer, and a blue emission layer may be stacked so as to emit white light, or a single-layer structure including a red emission material, a green emission material, and a blue emission material. The emission layer may include a first functional layer under the emission layer and/or a second functional layer on the emission layer. The first functional layer and/or the second functional layer may include a layer formed to extend continuously over each of the pixel electrodes 310. The layer may be patterned to correspond to each of the pixel electrodes 310.

The first functional layer may have a single-layer structure or a multi-layer structure. For example, in a case that the first functional layer may include a polymer material, the first functional layer, that may be a hole transport layer (HTL), may have a single layer structure which may include, but not be limited to, poly-(3,4)-ethylene-dihydroxy thiophene (PEDOT), polyaniline (PANT), or a combination thereof. In a case that the first functional layer may include a small molecular weight material, the first functional layer may include, for example, a hole injection layer (HIL) and an HTL.

The second functional layer may be omitted in other embodiments. For example, in a case that the first functional layer and the emission layer may include polymer materials, the second functional layer may be formed so that the organic light-emitting device OLED may have excellent operational characteristics. The second functional layer may have a single-layer structure or a multi-layer structure. The second functional layer may include an electron transport layer (ETL) and/or an electron injection layer (EIL).

The opposite electrode 330 may be disposed to face the pixel electrode 310 with the intermediate layer 320 therebetween. The opposite electrode 330 may include a conductive material having a small work function. For example, the opposite electrode 330 may include a (semi-)transparent layer including, but not limited to, Ag, Mg, Al, Pt, Pd, Au, Ni, Nd, Ir, Cr, Li, calcium (Ca), or an alloy thereof. As another example, the opposite electrode 330 may include, but not be limited to, a layer such as ITO, IZO, ZnO, $In_2O_3$, or a combination thereof, which may be on the (semi-)transparent layer including the materials described above. The opposite electrode 330 may be positioned on the intermediate layer 320 and the eighth insulating layer 118. The opposite electrode 330 may include a common electrode that may be formed as a single body disposed across each of the organic light-emitting devices OLED in the display area DA and which faces the each of the pixel electrodes 310.

A spacer for preventing a mask from being stamped may be disposed on the eighth insulating layer 118. A variety of functional layers, such as a polarization layer for reducing external light reflection, a black matrix, a color filter, and/or a touch screen layer having a touch electrode, may be provided on a thin-film encapsulation layer.

Because the organic light-emitting device OLED may be easily damaged by moisture or oxygen from the outside, an encapsulation layer 400 may cover the organic light-emitting device OLED so as to protect the organic light-emitting device OLED. The encapsulation layer 400 may cover the display area DA and may extend beyond the display area DA. The encapsulation layer 400 may include a first inorganic encapsulation layer 410, an organic encapsulation layer 420, and a second inorganic encapsulation layer 430, as shown in FIG. 5.

The first inorganic encapsulation layer 410 may cover the opposite electrode 330 and may include, but not be limited to, silicon oxide, silicon nitride and/or silicon oxynitride. Other layers including a capping layer may be between the first inorganic encapsulation layer 410 and the opposite electrode 330. Because the first inorganic encapsulation layer 410 may be formed according to formation contours of other components thereunder, a top surface of the first inorganic encapsulation layer 410 may not be flat, as shown in FIG. 5. The organic encapsulation layer 420 may cover the first inorganic encapsulation layer 410. A top surface of the organic encapsulation layer 420 may be substantially flat, unlike the first inorganic encapsulation layer 410. The top surface of the organic encapsulation layer 420 may be substantially flat at a portion thereof corresponding to the display area DA. The organic encapsulation layer 420 may include, but not be limited to, at least one material selected from the group consisting of PET, PEN, PC, PI, polyethylene sulfonate, polyoxymethylene (POM), and HMDSO, or a combination thereof. The second inorganic encapsulation layer 430 may cover the organic encapsulation layer 420 and may include silicon oxide, silicon nitride and/or silicon oxynitride. The second inorganic encapsulation layer 430 may contact the first inorganic encapsulation layer 410 outside the display area DA so that the organic encapsulation layer 420 may not be exposed to the outside.

In this way, the encapsulation layer 400 may include the first inorganic encapsulation layer 410, the organic encapsulation layer 420, and the second inorganic encapsulation layer 430. Thus, even in a case that cracks may occur in the encapsulation layer 400, the cracks may not occur between the first inorganic encapsulation layer 410 and the organic encapsulation layer 420 or between the organic encapsulation layer 420 and the second inorganic encapsulation layer 430. Thus, a path on which moisture or oxygen from the outside penetrates into the display area DA may be prevented, or the formation thereof may be minimized.

A polarization plate 520 may be positioned on the encapsulation layer 400 using an optically clear adhesive (OCA) 510. The polarization plate 520 may reduce external light reflection. For example, in a case that external light may pass through the polarization plate 520 and may be reflected from a top surface of the opposite electrode 330 and then pass through the polarization plate 520 again, the phase of the external light may be changed as the external light passes through the polarization plate 520 for a second time. As a result, the phase of reflected light may be different from the phase of the external light that enters the polarization plate 520 so that destructive interference occurs, and as such, external light reflection may be reduced and visibility may be improved. The OCA 510 and the polarization plate 520 may cover an opening of the seventh insulating layer 117, as shown in FIG. 5, for example. The display apparatus herein, however, may not always include the polarization plate 520. The polarization plate 520 may be omitted or replaced with other configurations, as appropriate. For example, the polarization plate 520 may be omitted, and external light reflection may be reduced using a black matrix and a color filter.

The buffer layer 110 may include an inorganic material, as referenced above, and the first through sixth insulating layers 111 to 116 may be referred to as an inorganic insulating layer 125. The inorganic insulating layer 125 may include at least one layer of the first through sixth insulating layers 111 to 116. A discussion of a case where the inorganic insulating layer 125 may not include the fourth insulating layer 114 follows below. The inorganic insulating layer 125 may include a groove corresponding to the bending area BA, as shown in FIG. 5. The groove may refer to an area in which a part of the inorganic insulating layer 125 may be removed in a downward direction (−DI3 direction) and another part thereof remains. For example, the buffer layer 110 may be continuous in the first area 1A, the bending area BA, and the second area 2A. The inorganic insulating layer 125 may have an opening OP 125 corresponding to the bending area BA. Thus, the opening OP 125 of inorganic insulating layer 125 may define a groove corresponding to the bending area BA. The inorganic insulating layer 125 may include a groove having a different shape than as shown. There may be various modifications where, for example, a part of the top surface (+DI3 direction) of the buffer layer 110 may be removed, and otherwise, a bottom surface (−DI3 direction) of the first insulating layer 111 may not be removed.

The groove corresponding to the bending area BA may overlap or face the bending area BA. For example, the area of the groove may be greater than the area of the bending area BA. To this end, in FIG. 5, a width GW of the groove may be greater than a width of the bending area BA. In this regard, the area of the groove may be defined as the area of an opening having a smallest area, from among openings of the inorganic insulating layer 125 that may define respectively same or similar grooves.

An organic material layer 180 may fill at least a part of the groove. For example, the organic material layer 180 may overlap or face the bending area BA. In doing so, the organic material layer 180 may extend beyond the bending area BA.

As discussed hereinabove, the wiring 40 may extend from the first area 1A to the second area 2A via the bending area BA. The wiring 40 may be positioned on the organic material layer 180. In a case that the organic material layer 180 and the groove may not be provided, the wiring 40 may be positioned on the inorganic insulating layer 125. As discussed, the wiring 40 may transmit an electrical signal into the display area DA. The wiring 40 may be simultaneously formed with the same material as that of each electrode discussed herein.

As shown in FIG. 1 the substrate 100 may be bent in the bending area BA. To this end, the display apparatus may be manufactured in a state in which the substrate 100 may be substantially flat at first. The substrate 100 may bent in the bending area BA so that the display apparatus may have substantially the shape as shown in FIG. 1. In a case that the substrate 100 may be bent in the bending area BA, a tensile stress may be applied to the wiring 40.

In a case that the substrate 100 may be bent and the inorganic insulating layer 125 may not include a groove in the bending area BA so as to have a continuously same shape from the first area 1A to the second area 2A and the wiring 40 may be positioned on the inorganic insulating layer 125, a large tensile stress may be applied to the wiring 40. Hardness of the inorganic insulating layer 125 may be higher than that of the organic material layer 180. Thus, there may be a high probability that cracks may occur in the inorganic insulating layer 125 in the bending area BA. In such a case, a probability that cracks may occur in in the wiring 40 causing a short-circuit of the wiring 40 may increase.

However, according to embodiments herein, the inorganic insulating layer 125 may include a groove in the bending area BA, as described above, and the part of the wiring 40 corresponding to the bending area BA may positioned on the organic material layer 180 that may fill at least a part of the groove of the inorganic insulating layer 125. Thus, a probability that cracks may occur in the inorganic insulating layer 125 may be decreased as a result. This is the case as the hardness of the organic material layer 180 may be lower than that of the inorganic insulating layer 125. Thus, the tensile stress that may occur due to bending of the substrate 100 may be absorbed by the organic material layer 180 so that the concentration of the tensile stress on the wiring 40 may be effectively minimized.

The organic material layer 180 may include the same material as a material forming an organic material layer included in the display area DA. For example, the organic material layer 180 may be simultaneously formed of the same material in a case that the seventh insulating layer 117 may be formed of an organic material. In another example, the organic material layer 180 may be simultaneously formed of the same material in a case that the eighth insulating layer 118 may be formed of an organic material. In another example, the organic material layer 180 may be simultaneously formed of the same material in a case that the organic encapsulation layer 420 of the encapsulation layer 400 may be formed of an organic material. The organic material layer 180 may also be formed separately from the seventh insulating layer 117, for example.

The display apparatus may include conductive layers 213A and 213B connected to each wiring 40. The conductive layers 213A and 213B may be disposed in the first area 1A or the second area 2A so that each wiring 40 may be positioned on a different layer. The conductive layers 213A and 213B may be electrically connected to each wiring 40. In FIG. 5, the conductive layers 213A and 213B may be formed with the same material as that of the gate electrode 213 of the thin-film transistor 210 and disposed on the same layer, i.e., on the first insulating layer 111. Each wiring 40 may be connected to a third connection electrode 214A disposed on the fifth insulating layer 115, and the third connection electrode 214A may be in contact with the conductive layers 213A and 213B via contact holes formed in the second insulating layer 112, the third insulating layer 113, and the fifth insulating layer 115. The conductive layer 213A may be in the first area 1A, and the conductive layer 213B may be in the second area 2A. Positions of the conductive layers 213A and 213B may not be limited to the above description, such that the conductive layers 213A and 213B may be on a top surface of one of the constituent layers of inorganic insulating layer 125.

The conductive layer 213A may be electrically connected to a thin-film transistor in the display area DA. Thus, each wiring 40 may be electrically connected to the thin-film transistor in the display area DA via the conductive layer 213A. The conductive layer 213B in the second area 2A may be electrically connected to the thin-film transistor in the display area DA via each wiring 40. Thus, the conductive layers 213A and 213B may be outside the display area DA and electrically connected to elements in the display area DA, and/or extend in a direction of the display area DA so as to dispose at least a part of the conductive layers 213A and 213B in the display area DA.

Each wiring 40 that may cross the bending area BA may include a material enabling elongation so that defects, such as cracks in each wiring 40 that may cause a short-circuit, may be prevented from occurring. The conductive layers 213A and 213B may be formed using a material having lower elongation characteristic than that of each wiring 40 and with different electrical/physical characteristics from those of each wiring 40. Thus, an efficiency of electrical signal transmission may be improved, and the occurrence of defects such as cracks may be reduced. For example, the conductive layers 213A and 213B may include Mo, and each wiring 40 may include Al. Each wiring 40 or the conductive layers 213A and 213B may have multiple layers, as appropriate.

In the conductive layer 213B in the second area 2A, unlike in FIG. 5, at least a part of an upper portion of the conductive layer 213B may not be covered by the seventh insulating layer 117 and may be exposed to the outside so that the conductive layer 213B may be electrically connected to a variety of electronic elements or a printed circuit board.

Each wiring 40 described above may be connected to the conductive layer 213B of the second area 2A via a fourth connection electrode 214B. The fourth connection electrode 214B may be formed similarly as the third connection electrode 214A.

The fourth connection electrode 214B may be connected to other fourth connection electrodes, which may be spaced apart from one another, via a connection wire part (see 40D of FIG. 2). The connection wire part 40D may be disposed on the fifth insulating layer 115 on which an uppermost side of the fourth connection electrode 214B may be disposed. Each wiring 40 may be positioned on the sixth insulating layer 116.

Positions of the wire parts 40A, 40B, and 40C and the position of the connection wire part 40D may not be limited to the above description. For example, the wire parts 40A, 40B, and 40C may be positioned on different layers from the connection wire part 40D. For example, in a case that the connection wire part 40D may be disposed on one of the first through sixth insulating layers 111 to 116, the wire parts 40A, 40B, and 40C may be disposed on the other one of the first through sixth insulating layers 111 to 116. The connection wire part 40D and the wire parts 40A, 40B, and 40C may be disposed on different insulating layers so that at least one of the wire parts 40A, 40B and 40C may be prevented from being connected to the connection wire part 40D. In other words, all three of the wire parts 40A, 40B, and 40C may not be connected to the connection wire part 40D.

The connection wire part 40D described above may be connected to the third connection electrode 214A and the fourth connection electrode 214B. In a case that multiple connection wire parts 40D may be provided, the multiple connection wire parts 40D may be arranged to be spaced apart from one another and disposed on an insulating layer on which others of the multiple connection wire parts 40D may be disposed, so that the connection wire parts 40D may not be connected to one another while overlapping or crossing one another.

A stress neutralization layer (SNL) 600 may be positioned outside the display area DA. For example, the SNL 600 may be positioned on each wiring 40 to correspond to at least the bending area BA.

In a case that a body including multiple layers may be bent, a neutral stress plane may be present. In a case that the SNL 600 may not be provided, an excessive tensile stress may be applied to each wiring 40 in the bending area BA according to bending of the substrate 100. This may be because the position of each wiring 40 may not correspond to the neutral stress plane. However, since the SNL 600 may be provided, and the thickness and modulus thereof may be adjusted so that the position of the neutral stress plane in a body such as the substrate 100, the wirings 40 and the SNL 600 may be adjusted to address the neutral stress plane. For example, the neutral stress plane may be shifted nearer to the wirings 40 via the SNL 600 so that the tensile stress applied to the wirings 40 may be minimized.

The SNL 600 may extend to ends of the substrate 100 of the display apparatus. For example, at least a part of the wirings 40, the conductive layers 213B and/or other conductive layers electrically connected therefrom in the second area 2A may not be covered by the seventh insulating layer 117 or the eighth insulating layer 118 but may be electrically connected to a variety of electronic elements or the printed circuit board. Thus, a portion inclusive of the wirings 40, the conductive layers 213B and/or other conductive layers electrically connected therefrom may be electrically connected to a variety of electronic elements or the printed circuit board. Such an electrically-connected portion may need to be protected from an impurity such as external moisture. Thus, the SNL 600 may cover the electrically-connected portion and thus may serve as a protective layer therefor. To this end, the SNL 600 may extend to ends or peripheral portions of the substrate 100 of the display apparatus, for example.

In FIG. 5, a top surface of the SNL 600 in the display area DA coincides with a top surface of the polarization plate 520. However, embodiments may not be limited thereto. For example, a distal end of the SNL 600 in the display area DA may cover a part of the top surface of ends of the polarization plate 520. As another example, the ends of the SNL 600 in the display area DA may not contact the polarization plate 520 and/or the OCA 510. While or after the SNL 600 may be formed, gas generated in the SNL 600 may move to an end of the display area DA and prevent an organic light-emitting device from being deteriorated.

In a case that the top surface of in the display area DA the SNL 600 in the display area DA coincides with the top surface of the polarization plate 520 or the ends of the SNL 600 in the display area DA cover a part of the top surface of the ends of the polarization plate 520, or the ends of the SNL 600 in the display area DA contact the OCA 510, the thickness of a part of the SNL 600 in the display area DA may be greater than a thickness of another part of the SNL 600. The SNL 600 may be formed via coating or curing a liquified or paste material. Thus, the volume of the SNL 600 during the curing process may be reduced. In a case that the part of the SNL 600 in the display area DA may contact the polarization plate 520 and/or the OCA 510, a position of a corresponding part of the SNL 600 may become fixed and thus the volume of a remaining part of the SNL 600 may be reduced. As a result, the thickness of the part of the SNL 600 in the display area DA may be greater than the thickness of another part of the SNL 600.

A touch electrode (not shown) including various patterns for a function of a touch screen may be positioned on the encapsulation layer 400. In order to protect the touch electrode, a touch protective layer for covering the touch electrode may be disposed. The display apparatus may include a protective film (not shown) for protecting a bottom surface (i.e., the −DI3 direction) of the substrate 100. The protective film may include an opening corresponding to the bending area BA.

Figure 6:
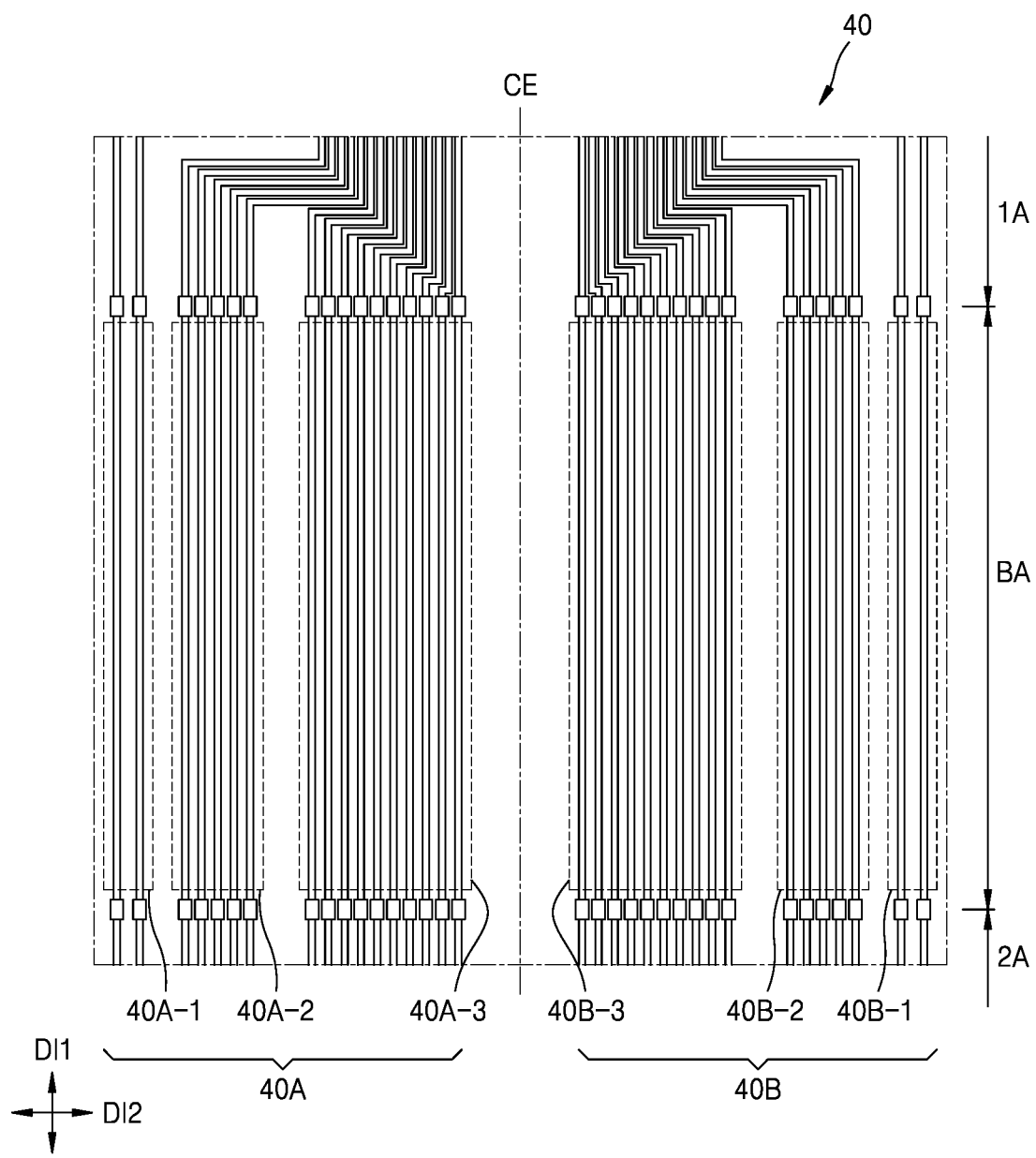
FIG. 6 shows an expanded plan view illustrating a wiring of FIG. 2.

Referring to FIG. 6, each wiring 40 may pass through the bending area BA and connect through the first area 1A and the second area 2A, as described above. As such, the wirings 40 may be arranged in the bending area BA and perpendicularly to the bending axis BAX.

The wirings 40 may be arranged in various forms. For example, a part of the wirings 40 through which signals having the same polarity pass, may form one group. Groups through which signals having the same polarity pass may be disposed to be symmetric with respect to another one based on an arbitrary (or imaginary) center line CE of the display apparatus that may be parallel to each wiring 40 while passing through the center of the second area 2A. The wirings 40 may be divided into a first group 40A-1 and 40B-1 forming wirings 40 to which signals having negative polarity may be transmitted, a second group 40A-2 and 40B-2 forming wirings 40 to which signals having positive polarity are transmitted, and a third group 40A-3 and 40B-3 forming wirings 40 to which signals to be changed into negative polarity or positive polarity may be transmitted. At least one of the first group 40A-1 and 40B-1, the second group 40A-2 and 40B-2, and the third group 40A-3 and 40B-3 may be provided as a pair and arranged to be symmetric with respect to each other based on the center line CE. For example, as shown in FIG. 6, the third group 40A-3 and 40B-3 may be closest to the center line CE, the second group 40A-2 and 40B-2 may be disposed outside the third group 40A-3 and 40B-3, and the first group 40A-1 and 40B-1 may be disposed outside the second group 40A-2 and 40B-2. The third group 40A-3 and 40B-3, the second group 40A-2 and 40B-2, and the first group 40A-1 and 40B-1 may be sequentially arranged from the center line CE to ends of the second area 2A. This arrangement may be the same at the left and right of the center line CE of FIG. 6. In the above-described case, the wirings 40 to which signals having the same polarity may be transmitted, may be arranged at both sides of the center line CE so that electrical stability may be attained. The arrangement of the wirings 40 described above may not be limited to the above description but may include configuration(s) in which one of the first group 40A-1 and 40B-1 through the third group 40A-3 and 40B-3, another one of the first group 40A-1 and 40B-1 through the third group 40A-3 and 40B-3, and another one of the first group 40A-1 and 40B-1 through the third group 40A-3 and 40B-3 are sequentially arranged.

In this regard, a first wire part 40A and a second wire part 40B of the wirings 40 may be arranged to be symmetric with respect to each other based on the center line CE. Each of the first wire parts 40A and the second wire parts 40B may include the first group 40A-1 and 40B-1 through the third group 40A-3 and 40B-3. The first group 40A-1 of the first wire part 40A and the first group 40B-1 of the second wire part 40B, the second group 40A-2 of the first wire part 40A and the second group 40B-2 of the second wire part 40B, and the third group 40A-3 of the first wire part 40A and the third group 40B-3 of the second wire part 40B may be arranged at the same position based on the center line CE so as to be symmetric with respect to each other.

Two different wirings 40 to which the same signal may be applied may be connected to each other via the connection wire part 40D. To do so, multiple connection wire parts 40D may be provided. The multiple connection wire parts 40D may be arranged to be spaced apart from one another and toward a terminal part 20. In a case that the connection wire parts 40D may be in the peripheral area of the first area 1A, the multiple connection wire parts 40D may be spaced apart from one another between the display area DA and the bending area BA. The multiple connection wire parts 40D may be arranged in a zigzag configuration on a plane. Lengths of parts of the multiple connection wire parts 40D may be different from each other.

Figure 7:
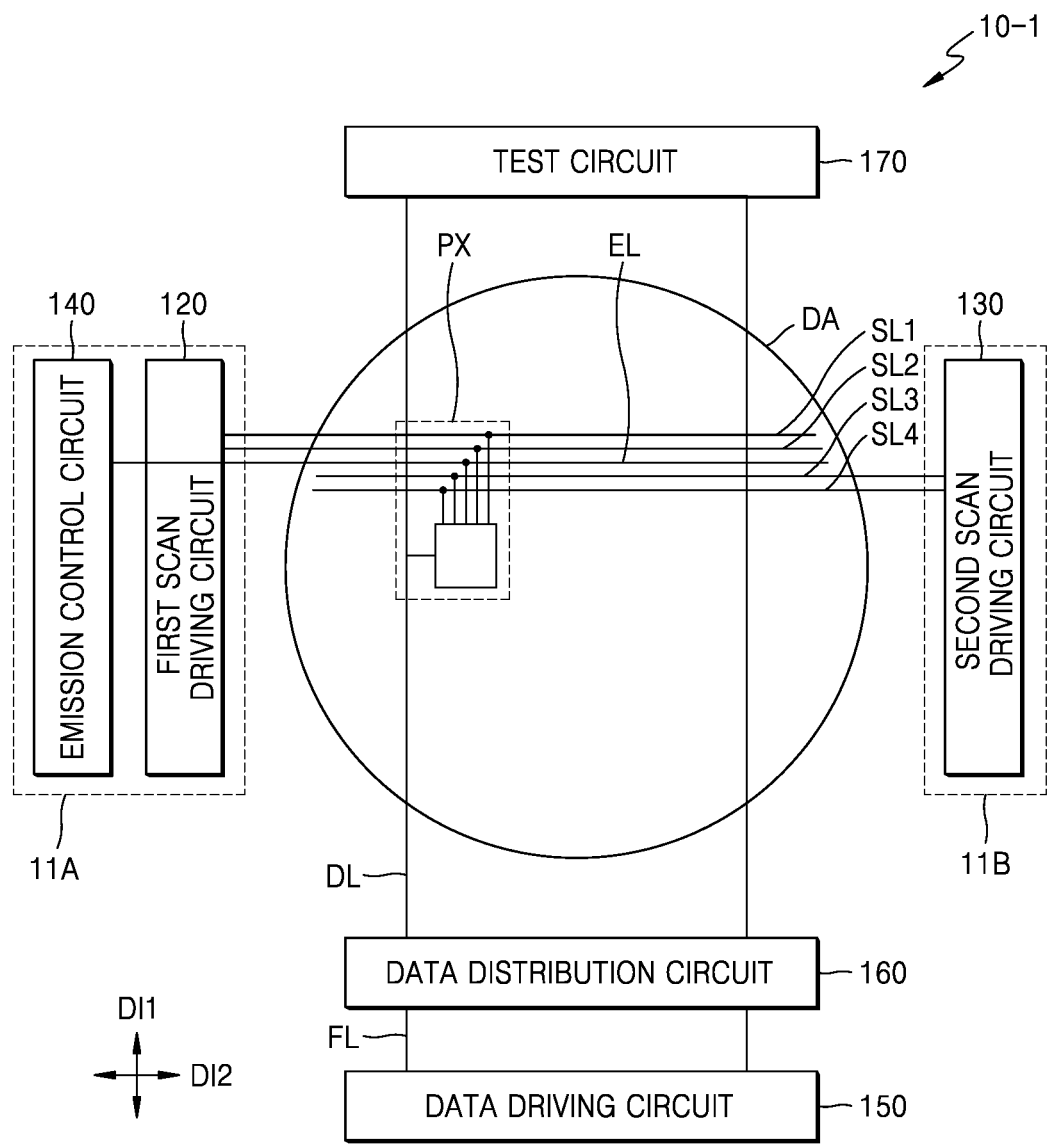
FIG. 7 shows a plan view illustrating a configuration of a layout of a display apparatus according to another embodiment.

FIG. 7 shows a view illustrating a configuration of a layout of a display apparatus according to another embodiment.

Referring to FIG. 7, a display apparatus 10-1 shown in FIG. 7 may include a data distribution circuit 160 and a test circuit 170, unlike in the display apparatus 10 shown in FIGS. 1 and 2.

The data distribution circuit 160 may be provided between the data driving circuit 150 and the display area DA and may transmit a data signal from the data driving circuit 150 to the data line DL. The data distribution circuit 160 may time-divide the data signal applied via one output line FL of the data driving circuit 150 to distribute the time-divided data signal to multiple data lines DL.

The test circuit 170 may apply a test signal to the data lines DL. The test circuit 170 may be connected to the terminals (see 21 and 22 of FIG. 2) via a part of the wirings 40 through a wire or conductive layer in the peripheral area. The test circuit 170 may apply various test signals within the display area DA.

Two different wire parts of the wirings 40 that may be connected to the test circuit 170 may be connected to each other via the connection wire part 40D.

Figure 8:
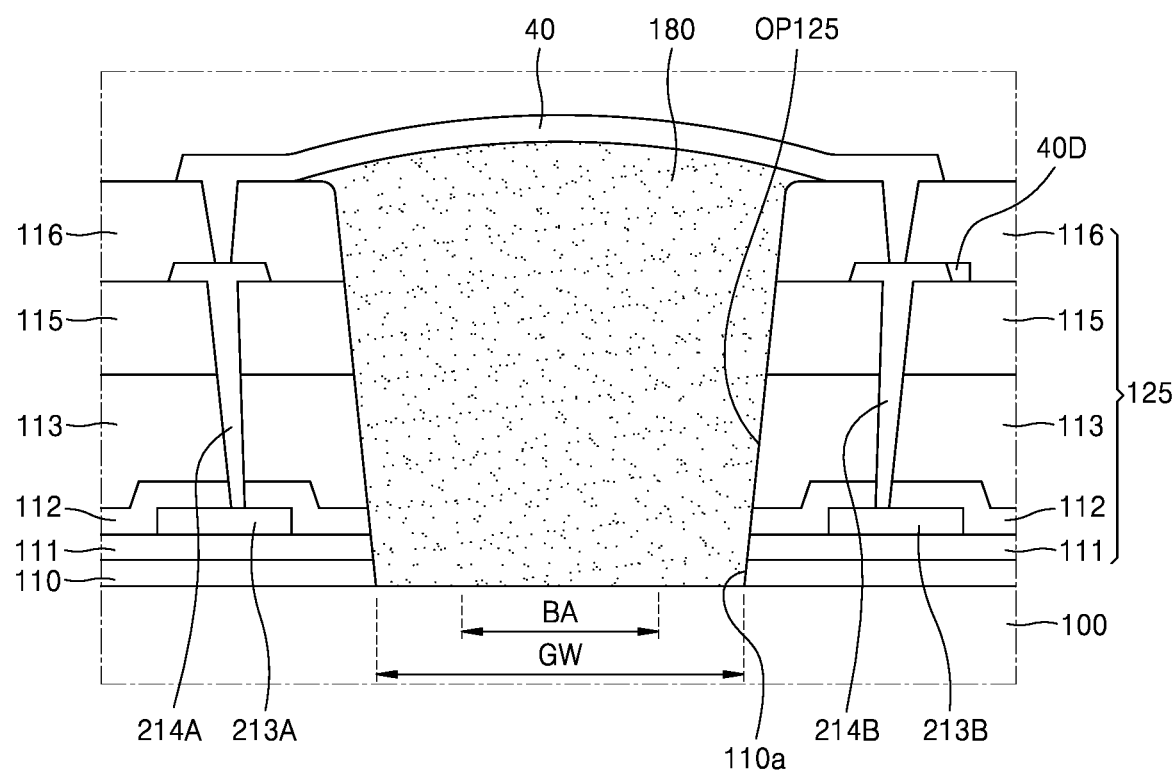
FIG. 8 shows a schematic cross-sectional view illustrating a bending portion of a display apparatus according to another embodiment.

FIG. 8 shows a schematic cross-sectional view illustrating a bending portion of a display apparatus according to another embodiment.

An inorganic insulating layer 125 may have an opening OP 125 corresponding to the bending area BA. The opening OP 125 of the inorganic insulating layer 125 may include an area in which a layer under the inorganic insulating layer 125 may be exposed. For example, the buffer layer 110, the first insulating layer 111 through the third insulating layer 113, the fifth insulating layer 115, and the sixth insulating layer 116 may have openings corresponding to the bending area BA and collectively defining the opening OP 125 of the inorganic insulating layer 125. The openings corresponding to the bending area BA may be understood to be openings that may overlap the bending area BA. The area of the openings may be greater than the area of the bending area BA. To this end, in FIG. 8, a width GW of the groove may be greater than a width of the bending area BA. The area of the openings may be defined as the area of an opening having the smallest area of the openings of the first through third insulating layers 111 to 113, the fifth insulating layer 115, and the sixth insulating layer 116. In FIG. 8, the area of the groove may be defined by the area of an opening 110a of the buffer layer 110.

Because the hardness of the inorganic insulating layer 125 may be higher than that of the organic material layer 180, the probability that cracks may occur in the inorganic insulating layer 125 in the bending area BA may be very high in the absence of the opening 110a. In a case that cracks may occur in the inorganic insulating layer 125, there may be an increase in probability that such cracks may propagate into the wiring 40. Formation of the groove in the inorganic insulating layer 125 as described herein may reduce the probability of the occurrence of cracks in the inorganic insulating layer 125, however. The opening 110a formed in the buffer layer 110 in the bending area BA may further reduce the aforementioned probability of cracks forming in the inorganic insulating layer 125.

Figure 9:
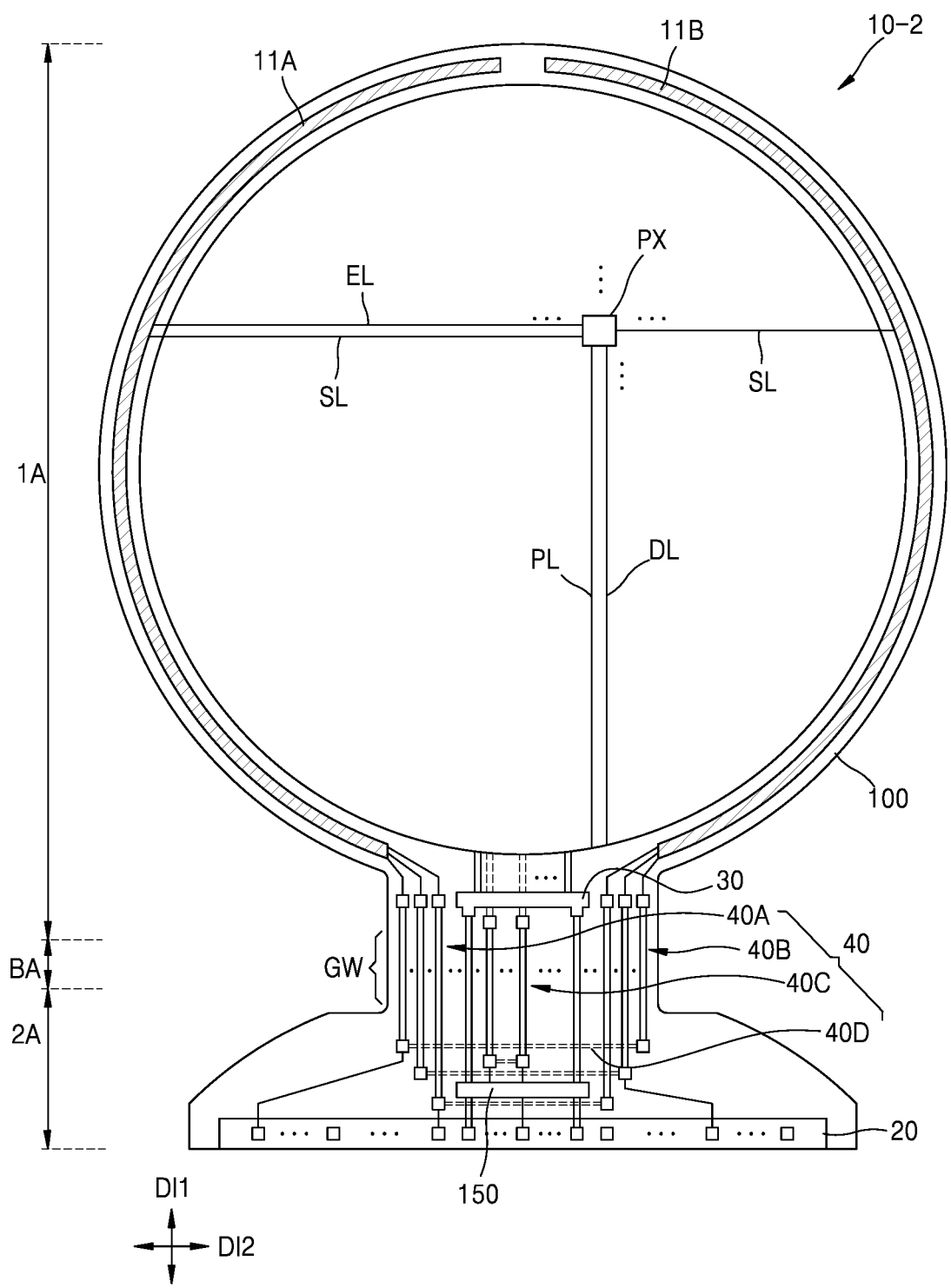
FIG. 9 shows a plan view illustrating a display apparatus according to another embodiment.

FIG. 9 shows a plan view illustrating a display apparatus according to another embodiment.

The data driving circuit 150 may be disposed in the second area 2A of the substrate 100. The data driving circuit 150 may be formed as a COP and disposed on the substrate 100.

The data driving circuit 150 may be connected to the data line DL disposed in the display area DA via the third wire part 40C. The data driving circuit 150 may be connected to the terminals 21 and 22. A FPCB (not shown) may be connected to the terminals 21 and 22, and thus signals may be input to the terminals 21 and 22 from the outside. The display apparatus 10-2 may include the connection wire part 40D, as described above. The connection wire part 40D may connect one first wire part 40A and one second wire part 40B, which may be respectively connected to the first driver 11A and the second driver 11B, so as to simultaneously transmit a commonly-used or the same signal of signals transmitted to the first driver 11A and the second driver 11B.

Figure 10:
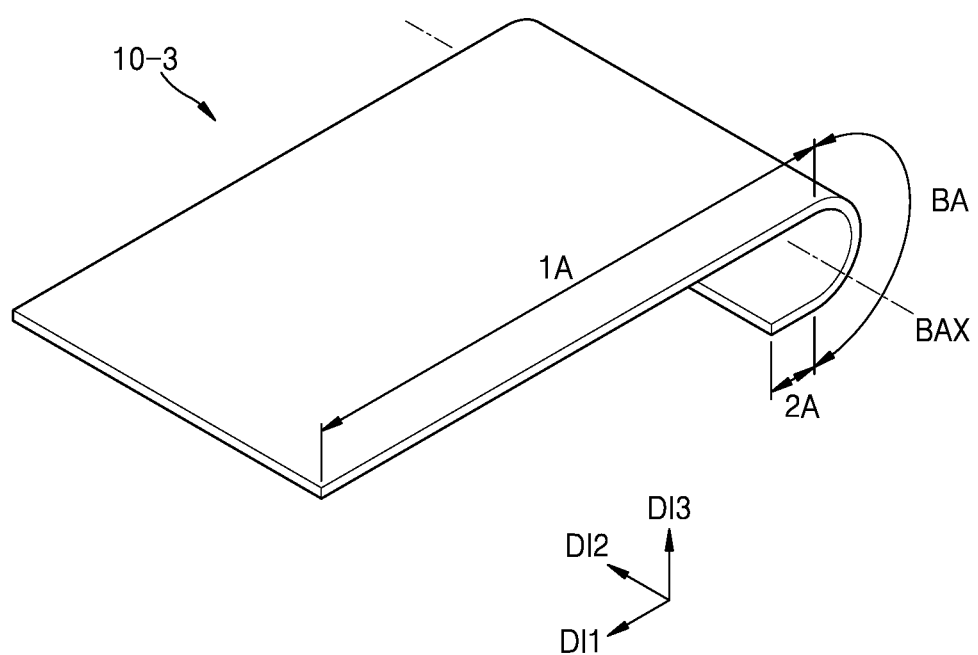
FIG. 10 shows a perspective view illustrating a display apparatus according to another embodiment.

FIG. 10 shows a perspective view illustrating a display apparatus according to another embodiment.

Referring to FIG. 10, a display apparatus 10-3 may be similar to that of at least one of FIGS. 1 through 9. The substrate 100 of the display apparatus 10-3 may include a first area 1A, a second area 2A, and a bending area BA. The substrate 100 may have a rectangular shape.

The substrate 100 may be bent around a bending axis BAX in the bending area BA, as shown in FIG. 10.

The display area DA and the peripheral area PA may be in the first area 1A. The display area DA may have a quadrangular shape. For example, the display area may have a rectangular shape.

The display apparatus 10-3 may include wire parts and a connection wire part, similar to those of FIG. 2.

The display apparatus 10-3 may include a first driver and a second driver, similar to those of FIG. 2. The connection wire part described above may connect the wire parts that may be connected to the first driver and the second driver, respectively, to each other.

Figure 11:
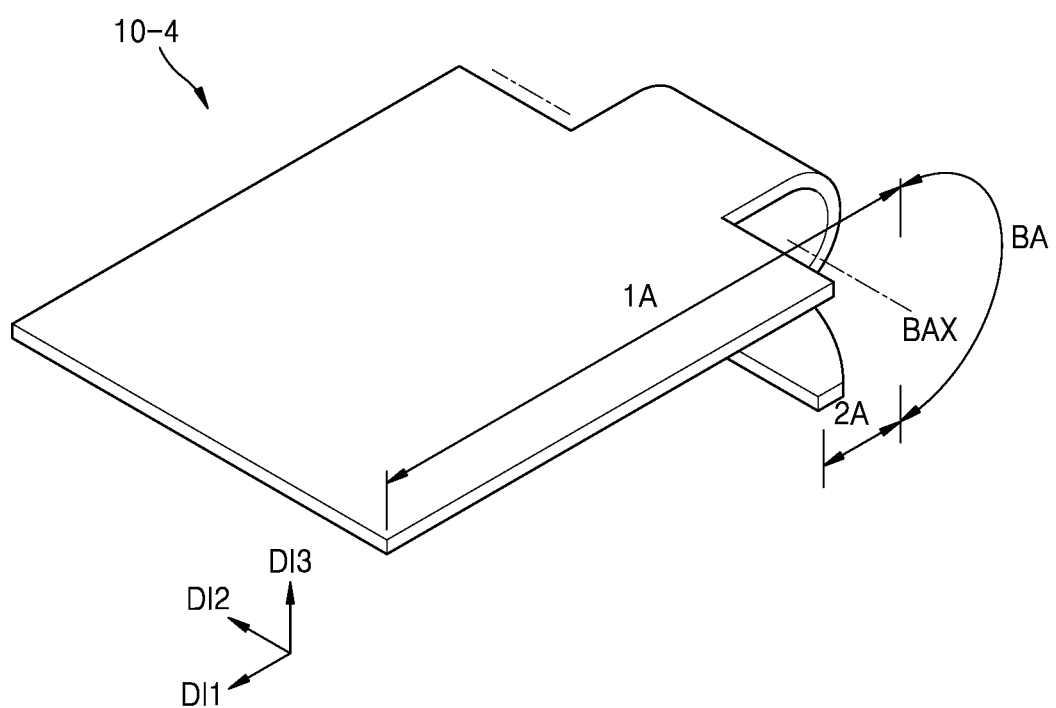
FIG. 11 shows a perspective view illustrating a display apparatus according to another embodiment.

FIG. 11 shows a perspective view illustrating a display apparatus according to another embodiment.

Referring to FIG. 11, a display apparatus 10-4 may include a first area 1A, a second area 2A, and a bending area BA. The first area 1A may have a polygonal shape. For example, the first area 1A may have a quadrangular shape, as shown in FIG. 11. The second area 2A and the bending area BA may be formed similarly to such areas as shown in FIG. 1.

In the display apparatus 10-4, a wire part may be disposed, as shown in FIGS. 1 through 9.

In a display apparatus according to one or more embodiments, the size of a connector may be reduced, and various signals may be simultaneously and precisely transmitted. The size of the display apparatus according to one or more embodiments may be minimized wherein connections at the connector may be accommodated in a reduced space thereof, without disturbing signal transmission.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
a display comprising a display area and a non-display area;
a first driver in the non-display area;
a plurality of first wire parts disposed in the non-display area and electrically connected to the first driver;
a second driver in the non-display area, the second driver being spaced apart from the first driver;
a plurality of second wire parts disposed in the non-display area and electrically connected to the second driver;
a bending portion connected to the display;
a connector connected to the bending portion, wherein wire parts of the plurality of first wire parts and the plurality of second wire parts, to which signals having the same polarity are transmitted, are symmetric with respect to one another based on an arbitrary center line of the connector.

2. The display apparatus of claim 1, further comprising a connection wire part that electrically connects one of plurality of first wire parts and one of plurality of second wire parts.

3. The display apparatus of claim 2, wherein the connection wire part is disposed in the connector.

4. The display apparatus of claim 2, further comprising a terminal connected to the connection wire part.

5. The display apparatus of claim 1, further comprising a data driving circuit disposed in the connector.

6. The display apparatus of claim 1, wherein the display area has a circular shape.

7. The display apparatus of claim 1, wherein
one of plurality of the first wire parts and one of plurality of the second wire parts are disposed on a same layer, and
a connection wire part is disposed on a different layer than the same layer on which one of plurality of the first wire parts and one of plurality of the second wire parts are disposed.

8. The display apparatus of claim 1, wherein
at least one of one of plurality of the first wire parts, one of plurality of the second wire parts, and the connection wire part are disposed in a different direction than another thereof.

9. The display apparatus of claim 8, wherein
at least one of one of plurality of the first wire parts and one of plurality of the second wire parts extends perpendicularly with respect to a bending axis of the bending portion, and
the connection wire part extends parallel to the bending axis of the bending portion.

10. The display apparatus of claim 1, wherein the plurality of first wire parts and the plurality of second wire parts are disposed to be symmetric with respect to another one based on the arbitrary center line.

11. The display apparatus of claim 1, wherein
the display comprises a gate electrode on the display area, and
at least one of one of plurality of the first wire parts and one of plurality of the second wire parts have same material as the gate electrode.

12. The display apparatus of claim 1, wherein one of the plurality of first wiring parts or the plurality of second wiring parts include at least two groups having a plurality of wiring parts of one of the plurality of first wiring parts or the plurality of second wiring parts to which signals having same polarity are transmitted.

13. A display apparatus, comprising:
a substrate having a bending portion between a first area and a second area of the substrate;
an inorganic insulating layer on the substrate, the inorganic insulating layer including an opening corresponding to the bending portion;
a plurality of wire parts extending from the first area into the second area via the bending portion and disposed on the inorganic insulating layer to overlap the opening; and
an organic material layer between the inorganic insulating layer and the plurality of wire parts, the organic material layer filling the opening, wherein
a part of the plurality of wire parts is connected to a first driver in the first area,
another part of the plurality of wire parts is connected to a second driver in the first area, and
wire parts of the plurality of wire parts, to which signals having same polarity are transmitted, are symmetric with respect to each other based on an arbitrary center line of the second area.

14. The display apparatus of claim 13, wherein the connection wire part is in the second area.

15. The display apparatus of claim 13, wherein the connection wire part is connected to a terminal.

16. The display apparatus of claim 13, wherein the connection wire part is disposed on the inorganic insulating layer differently than the plurality of wire parts.

17. The display apparatus of claim 13, wherein
the arbitrary center line of the display apparatus extends between the plurality of wire parts to divide the plurality of wire parts equally on either side of the arbitrary center line.

18. The display apparatus of claim 13, wherein one of the part of the plurality of wiring parts or another of the other part of the plurality of wiring parts include at least two groups having a plurality of wiring parts to which signals having same polarity are transmitted.

19. The display apparatus of claim 13, further comprising:
a plurality of connection wire parts, wherein
the plurality of connection wire parts are spaced apart from one another on a plane to respectively connect the part of the plurality of wire parts connected to the first driver in the first area with the another part of the plurality of wire parts connected to the second driver in the first area.

20. The display apparatus of claim 13, wherein the first area has a circular shape.

21. The display apparatus of claim 13, further comprising a data driving circuit in the second area.

22. The display apparatus of claim 13, wherein each of the wire parts of the plurality of wire parts and the connection wire part are disposed in different directions with respect to each other.

23. The display apparatus of claim 22, wherein
the each of the wire parts extends perpendicularly with respect to a bending axis of the bending portion, and
the connection wire part extends parallel to the bending axis of the bending portion.

24. The display apparatus of claim 13, wherein one of the plurality of the wire parts includes same material as an gate electrode on the substrate.

25. The display apparatus of claim 1, wherein
each of the plurality of first wiring parts and the plurality of second wiring parts include at least two groups having a plurality of wiring parts of each of the plurality of first wiring parts and the plurality of second wiring parts to which signals having same polarity are transmitted, and
one of at least two groups of the plurality of first wiring parts is symmetric with respect to one of at least two groups of the plurality of second wiring parts based on the arbitrary center line of the connector.

26. The display apparatus of claim 25, wherein signals having same polarity are transmitted to the plurality of wiring parts of one of at least two groups of the plurality of first wiring parts and the plurality of wiring parts of one of at least two groups of the plurality of second wiring parts.

27. The display apparatus of claim 1, wherein
one of the plurality of first wiring parts or the plurality of second wiring parts include at least two groups having a plurality of wiring parts of one of the plurality of first wiring parts or the plurality of second wiring parts, and
one of at least two groups of the plurality of first wiring parts is disposed apart from another of at least two groups of the plurality of first wiring parts or one of at least two groups of the plurality of second wiring parts is disposed apart from another of at least two groups of the plurality of second wiring parts.

* * * * *